United States Patent
Bower et al.

(10) Patent No.: US 10,297,502 B2
(45) Date of Patent: May 21, 2019

(54) ISOLATION STRUCTURE FOR MICRO-TRANSFER-PRINTABLE DEVICES

(71) Applicants: X-Celeprint Limited, Cork (IE); X-FAB Semiconductor Foundries AG, Erfurt (DE)

(72) Inventors: Christopher Andrew Bower, Raleigh, NC (US); Ronald S. Cok, Rochester, NY (US); William Andrew Nevin, Devon (GB); Gabriel Kittler, Ilmenau (DE)

(73) Assignees: X-Celeprint Limited, Cork (IE); X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 15/445,728

(22) Filed: Feb. 28, 2017

(65) Prior Publication Data
US 2018/0174910 A1 Jun. 21, 2018

Related U.S. Application Data

(60) Provisional application No. 62/436,038, filed on Dec. 19, 2016.

(51) Int. Cl.
*H01L 25/00* (2006.01)
*H01L 21/78* (2006.01)
(Continued)

(52) U.S. Cl.
CPC ...... *H01L 21/7806* (2013.01); *H01L 21/6835* (2013.01); *H01L 21/76283* (2013.01);
(Continued)

(58) Field of Classification Search
CPC ... H01L 25/50; H01L 27/088; H01L 27/1211; H01L 27/092; H01L 27/12;
(Continued)

(56) References Cited

U.S. PATENT DOCUMENTS 3,673,471 A * 6/1972 Klein ................. H01L 29/00
148/DIG. 106
5,475,224 A 12/1995 Koh
(Continued)

FOREIGN PATENT DOCUMENTS

EP 1531489 A2 5/2005
JP 2005108943 A 4/2005
(Continued)

OTHER PUBLICATIONS

Cok, R. S. et al., AMOLED displays with transfer-printed integrated circuits, Journal of the SID, 19(4):335-341 (2011).
(Continued)

*Primary Examiner* — Chuong A Luu
(74) *Attorney, Agent, or Firm* — William R. Haulbrook; Michael D. Schmitt; Choate, Hall & Stewart LLP

(57) ABSTRACT

A semiconductor structure suitable for micro-transfer printing includes a semiconductor substrate and a patterned insulation layer disposed on or over the semiconductor substrate. The insulation layer pattern forms one or more etch vias in contact with the semiconductor substrate. Each etch via is exposed. A semiconductor device is disposed on the patterned insulation layer and is surrounded by an isolation material in one or more isolation vias that are adjacent to the etch via. The etch via can be at least partially filled with a semiconductor material that is etchable with a common etchant as the semiconductor substrate. Alternatively, the etch via is empty and the semiconductor substrate is patterned to form a gap that separates at least a part of the semiconductor device from the semiconductor substrate and forms a tether physically connecting the semiconductor device to an anchor portion of the semiconductor substrate or the patterned insulation layer.

13 Claims, 29 Drawing Sheets

(51) Int. Cl.
*H01L 21/762* (2006.01)
*H01L 21/683* (2006.01)
*H01L 21/84* (2006.01)

(52) U.S. Cl.
CPC .............. *H01L 21/84* (2013.01); *H01L 25/50* (2013.01); *H01L 2221/6835* (2013.01); *H01L 2221/68318* (2013.01); *H01L 2221/68354* (2013.01); *H01L 2221/68368* (2013.01); *H01L 2221/68381* (2013.01)

(58) Field of Classification Search
CPC . H01L 27/1203; H01L 27/0629; H01L 29/66; H01L 29/66795; H01L 29/6653; H01L 29/7853; H01L 29/66545; H01L 29/78; H01L 29/0649; H01L 29/66477
USPC .......................................................... 257/88
See application file for complete search history.

(56) References Cited

U.S. PATENT DOCUMENTS

| | | | |
|---|---|---|---|
| 5,621,555 A | 4/1997 | Park | |
| 5,815,303 A | 9/1998 | Berlin | |
| 5,882,532 A | 3/1999 | Field et al. | |
| 6,051,472 A * | 4/2000 | Abiko | H01L 21/76831 |
| | | | 148/DIG. 50 |
| 6,142,358 A | 11/2000 | Cohn et al. | |
| 6,278,242 B1 | 8/2001 | Cok et al. | |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 6,969,624 B2 | 11/2005 | Iwafuchi et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,354,801 B2 | 4/2008 | Sugiyama et al. | |
| 7,399,693 B2 | 7/2008 | Sekiguchi et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,558,243 B2 | 10/2013 | Bibl et al. | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,779,484 B2 * | 7/2014 | Shen | H01L 27/1462 |
| | | | 257/294 |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,877,648 B2 | 11/2014 | Bower et al. | |
| 8,889,485 B2 | 11/2014 | Bower | |
| 8,895,406 B2 | 11/2014 | Rogers et al. | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,105,714 B2 | 8/2015 | Hu et al. | |
| 9,142,468 B2 | 9/2015 | Bower et al. | |
| 9,153,171 B2 | 10/2015 | Sakariya et al. | |
| 9,161,448 B2 | 10/2015 | Menard et al. | |
| 9,166,114 B2 | 10/2015 | Hu et al. | |
| 9,178,123 B2 | 11/2015 | Sakariya et al. | |
| 9,240,397 B2 | 1/2016 | Bibl et al. | |
| 9,358,775 B2 | 6/2016 | Bower et al. | |
| 9,367,094 B2 | 6/2016 | Bibl et al. | |
| 9,434,150 B2 | 9/2016 | Bower et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,601,356 B2 * | 3/2017 | Bower | H01L 21/561 |
| 9,640,715 B2 | 5/2017 | Bower et al. | |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,865,832 B2 | 1/2018 | Bibl et al. | |
| 9,929,053 B2 | 3/2018 | Bower et al. | |
| 9,947,584 B2 | 4/2018 | Bower et al. | |
| 9,991,413 B2 | 6/2018 | Bower et al. | |
| 2003/0062580 A1 | 4/2003 | Sato et al. | |
| 2003/0141570 A1 | 7/2003 | Chen et al. | |
| 2005/0189610 A1 * | 9/2005 | Usuda | H01L 21/76243 |
| | | | 257/510 |
| 2006/0063309 A1 | 3/2006 | Sugiyama et al. | |
| 2006/0079010 A1 | 4/2006 | Hara et al. | |
| 2006/0145177 A1 | 7/2006 | Hagimoto et al. | |
| 2007/0032089 A1 | 2/2007 | Nuzzo et al. | |
| 2007/0173034 A1 | 7/2007 | Tsurume et al. | |
| 2007/0281556 A1 | 12/2007 | Elliott et al. | |
| 2008/0079246 A1 | 4/2008 | Dix | |
| 2008/0108171 A1 | 5/2008 | Rogers et al. | |
| 2009/0202089 A1 | 8/2009 | Zhang et al. | |
| 2010/0123268 A1 | 5/2010 | Menard | |
| 2010/0248484 A1 | 9/2010 | Bower et al. | |
| 2010/0306993 A1 | 12/2010 | Mayyas et al. | |
| 2010/0317132 A1 | 12/2010 | Rogers et al. | |
| 2010/0326518 A1 | 12/2010 | Juso et al. | |
| 2012/0228669 A1 | 9/2012 | Bower et al. | |
| 2012/0314388 A1 | 12/2012 | Bower et al. | |
| 2013/0069275 A1 | 3/2013 | Menard et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2014/0084240 A1 | 3/2014 | Hu et al. | |
| 2014/0104243 A1 | 4/2014 | Sakariya et al. | |
| 2014/0159043 A1 | 6/2014 | Sakariya et al. | |
| 2014/0264763 A1 | 9/2014 | Meitl et al. | |
| 2014/0267683 A1 | 9/2014 | Bibl et al. | |
| 2014/0340900 A1 | 11/2014 | Bathurst et al. | |
| 2014/0367633 A1 | 12/2014 | Bibl et al. | |
| 2015/0028362 A1 | 1/2015 | Chan et al. | |
| 2015/0135525 A1 | 5/2015 | Bower | |
| 2015/0137153 A1 * | 5/2015 | Bibl | H01L 33/44 |
| | | | 257/88 |
| 2015/0137187 A1 | 5/2015 | Aoki et al. | |
| 2015/0371874 A1 | 12/2015 | Bower et al. | |
| 2015/0372053 A1 | 12/2015 | Bower et al. | |
| 2015/0372187 A1 | 12/2015 | Bower et al. | |
| 2016/0020131 A1 | 1/2016 | Bower et al. | |
| 2016/0086855 A1 | 3/2016 | Bower et al. | |
| 2016/0093600 A1 | 3/2016 | Bower et al. | |
| 2017/0047306 A1 | 2/2017 | Meitl et al. | |

(56) References Cited

U.S. PATENT DOCUMENTS

| | | |
|---|---|---|
| 2017/0062235 A1* | 3/2017 | Kim .................. H01L 21/31116 |
| 2017/0154819 A1 | 6/2017 | Bower et al. |
| 2017/0173852 A1 | 6/2017 | Moore et al. |
| 2017/0256521 A1 | 9/2017 | Cok et al. |
| 2017/0338374 A1 | 11/2017 | Zou et al. |
| 2018/0096964 A1 | 4/2018 | Bonafede et al. |
| 2018/0166337 A1 | 6/2018 | Bower et al. |
| 2018/0204772 A1 | 7/2018 | Bower et al. |

FOREIGN PATENT DOCUMENTS

| | | |
|---|---|---|
| JP | 2005259912 A | 9/2005 |
| JP | 2006108441 A | 4/2006 |
| JP | 2009105450 A | 5/2009 |
| JP | 2011066130 A | 3/2011 |
| WO | WO-2008/036837 A2 | 3/2008 |
| WO | WO-2008/103931 A2 | 8/2008 |
| WO | WO-2010/111601 A2 | 9/2010 |
| WO | WO-2011/123285 A1 | 10/2011 |
| WO | WO-2012/018997 A2 | 2/2012 |
| WO | WO-2015/193435 A1 | 12/2015 |
| WO | WO-2016/120400 A1 | 8/2016 |
| WO | WO-2018/114583 A1 | 6/2018 |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Lothian, J. R. et al., Wet and Dry Etching Characteristics of $Al_{0.5}In_{0.5}P$, Journal of Vacuum Science & Technology B, Microelectronics Processing and Phenomena USA, 10(3):1061-1065 (1992).

Yazawa, Y. et al., GaInP Single-Junction and GaInP/GaAs Two-Junction Thin-Film Solar Cell Structures by Epitaxial Lift-Off, Solar Energy Materials and Solar Cells, Elsevier Science Publishers, Amsterdam, 50(1-4):229-235 (1998).

International Search Report, PCT/EP2017/082795 (Isolation Structure for Micro-Transfer-Printable Devices, filed Dec. 14, 2017), issued by ISA/EPO, 4 pages, dated Jun. 7, 2018.

Written Opinion, PCT/EP2017/082795 (Isolation Structure for Micro-Transfer-Printable Devices, filed Dec. 14, 2017), issued by ISA/EPO, 7 pages, dated Jun. 7, 2018.

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100, (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A. J. et al., Precision transfer printing of ultra-thin AlInGaN micron-size light-emitting diodes, Crown, 978-1-4577-1507-5/13:217-218 (2012).

\* cited by examiner

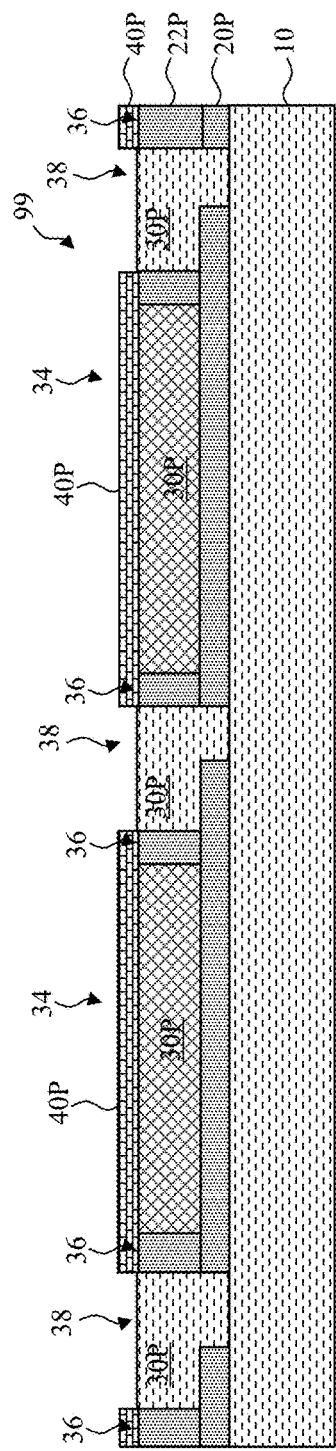
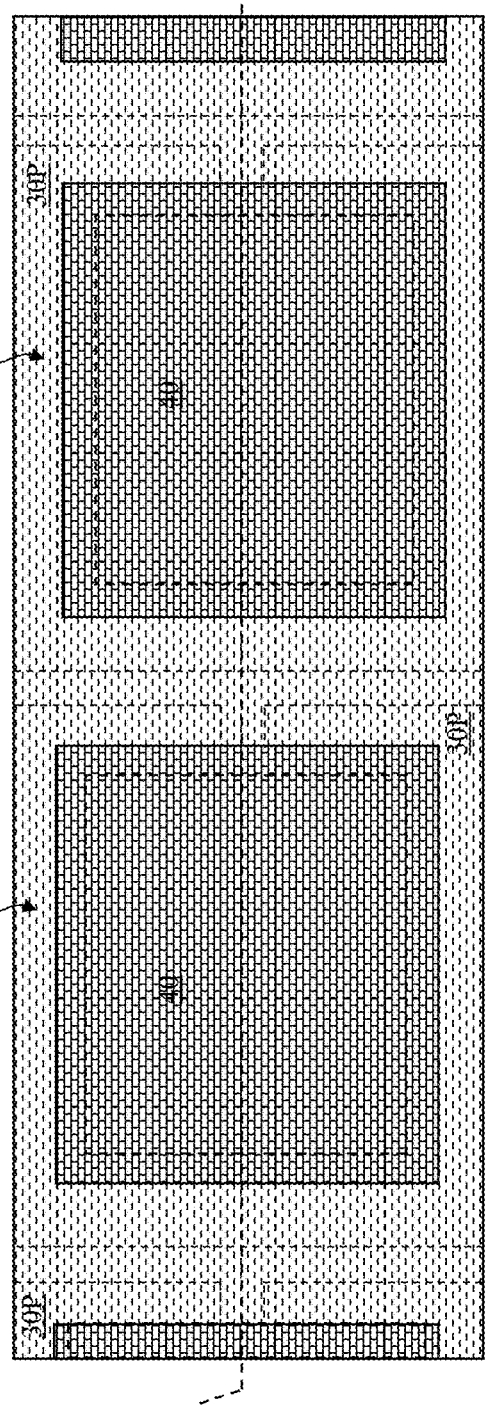

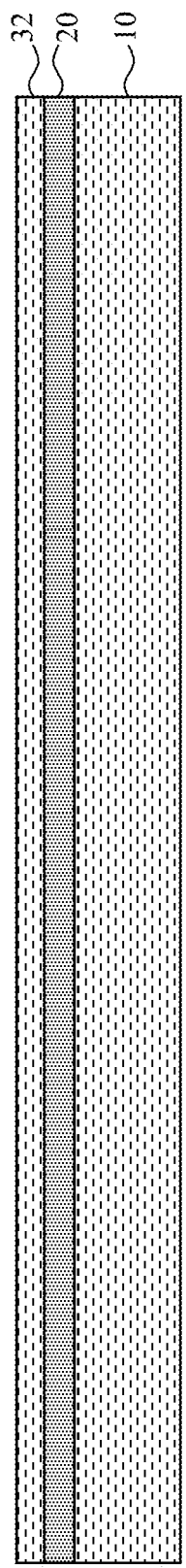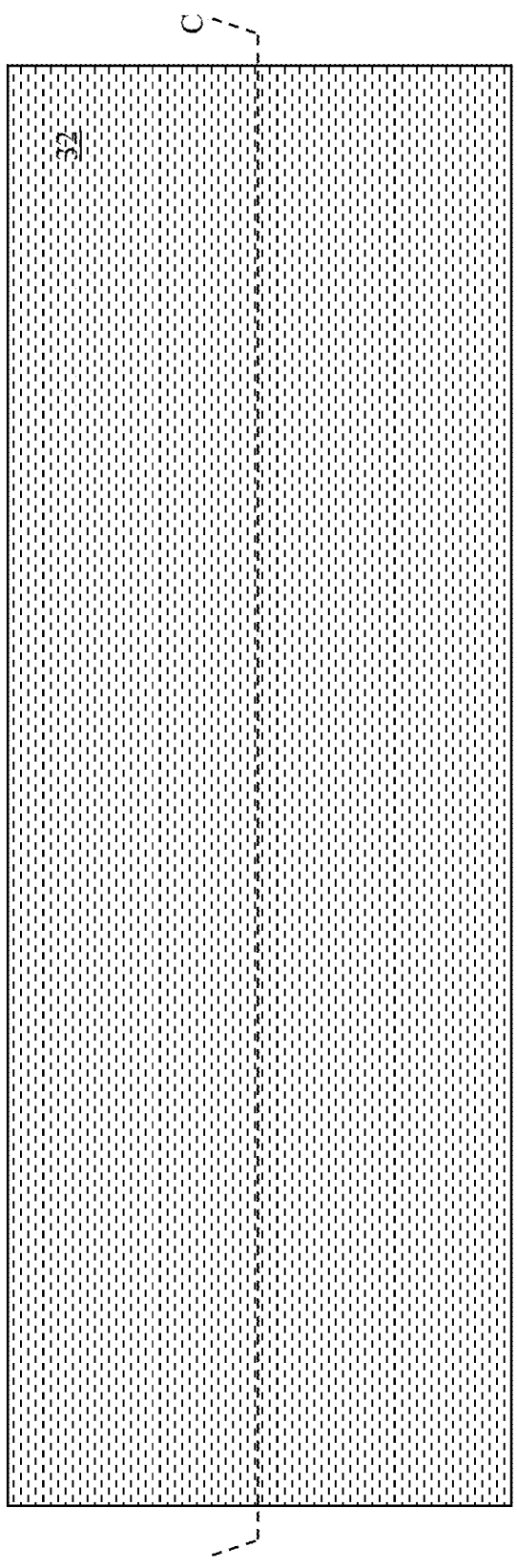
FIG. 15A
FIG. 15B

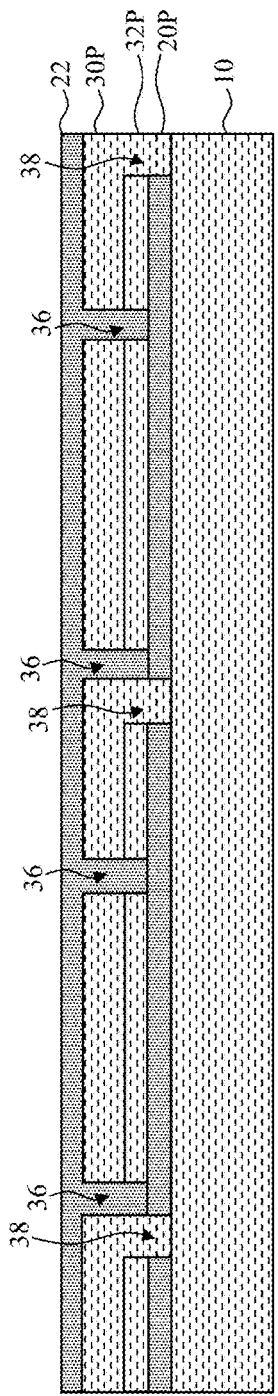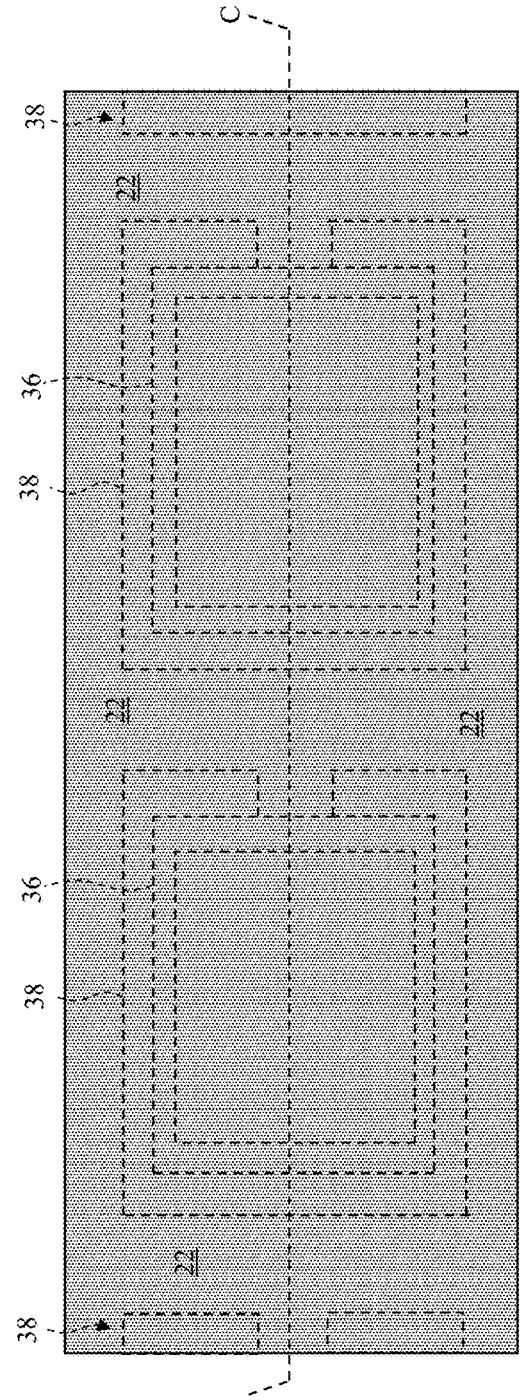
FIG. 19A
FIG. 19B

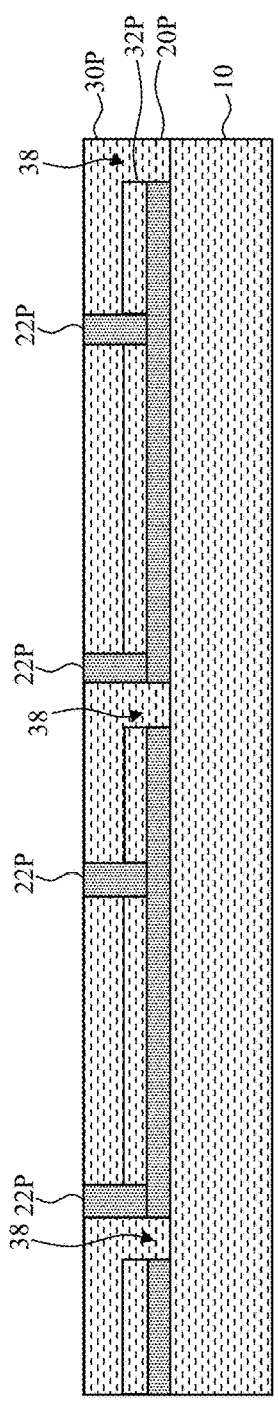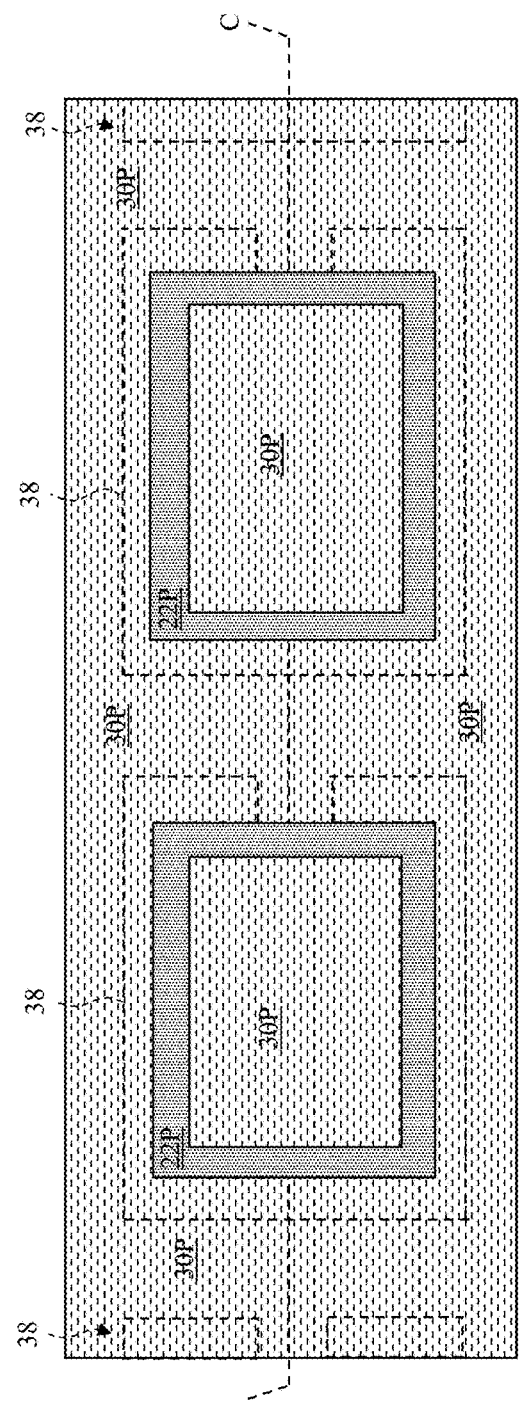
FIG. 20A
FIG. 20B

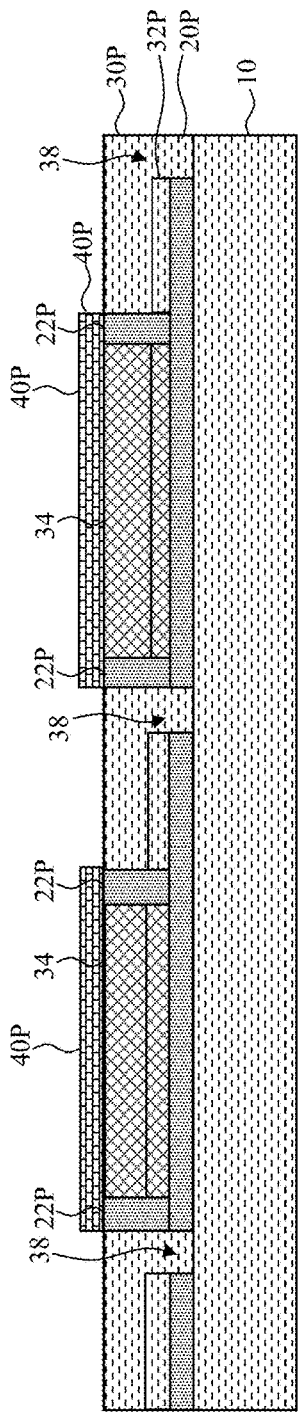
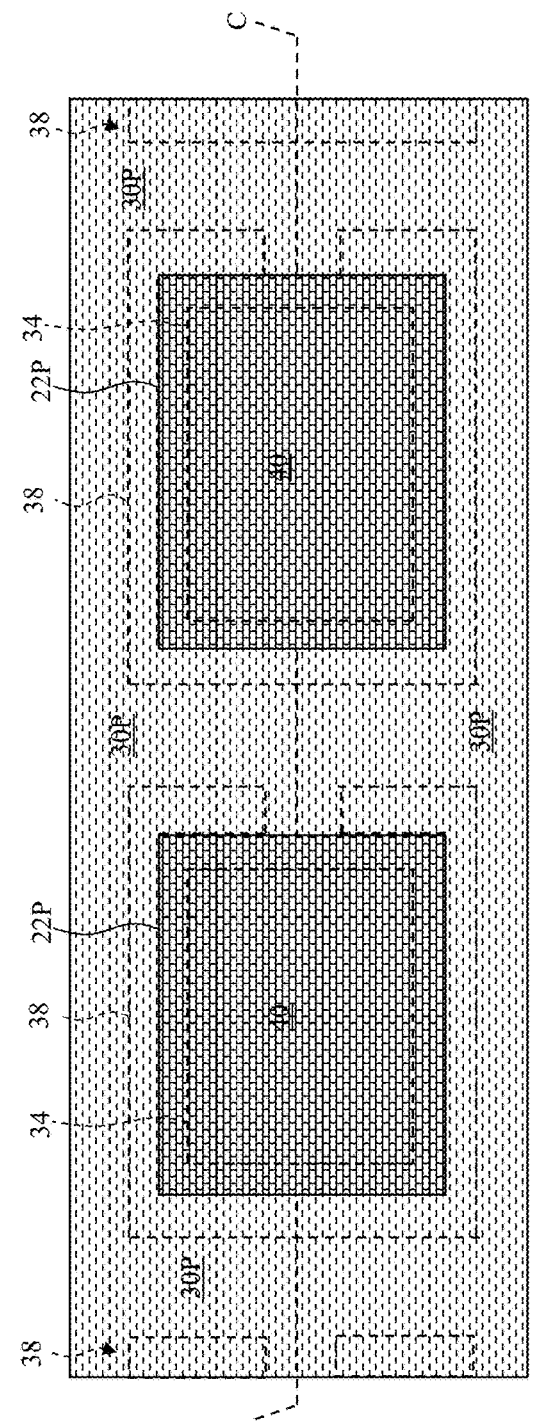
FIG. 23A
FIG. 23B

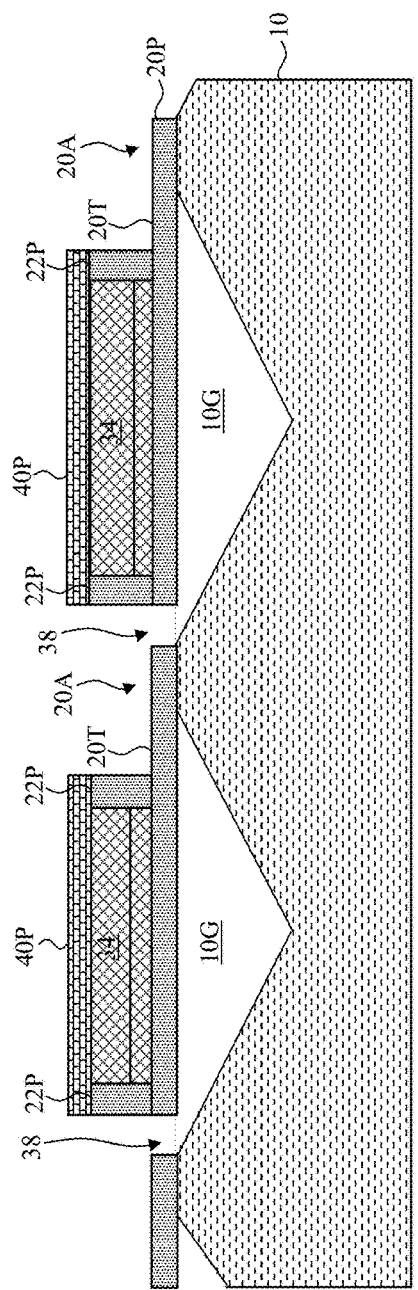
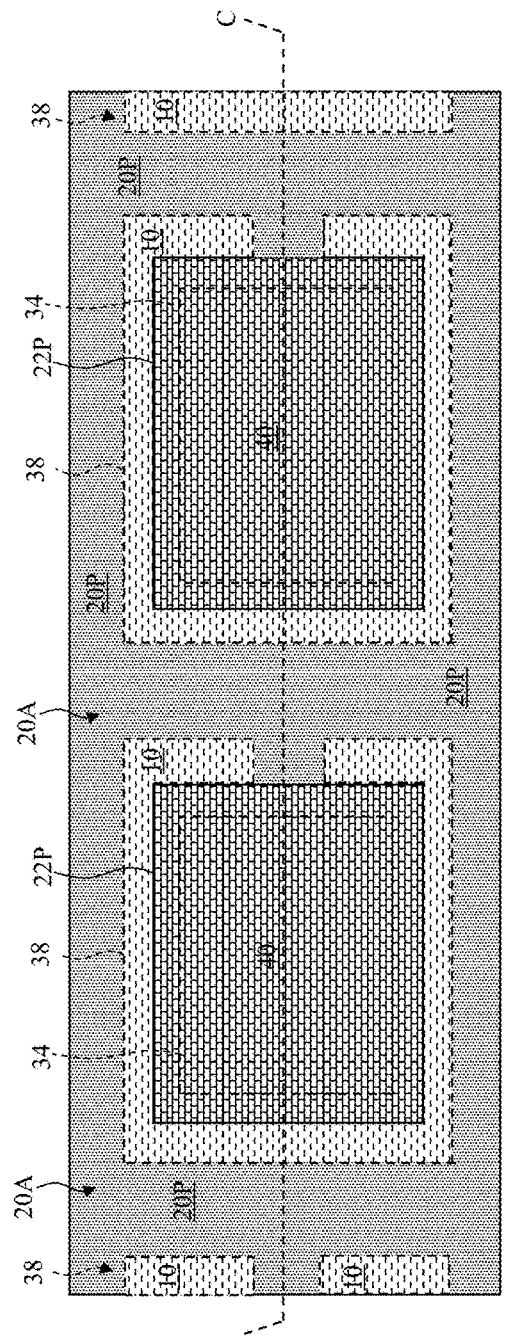
FIG. 24A
FIG. 24B

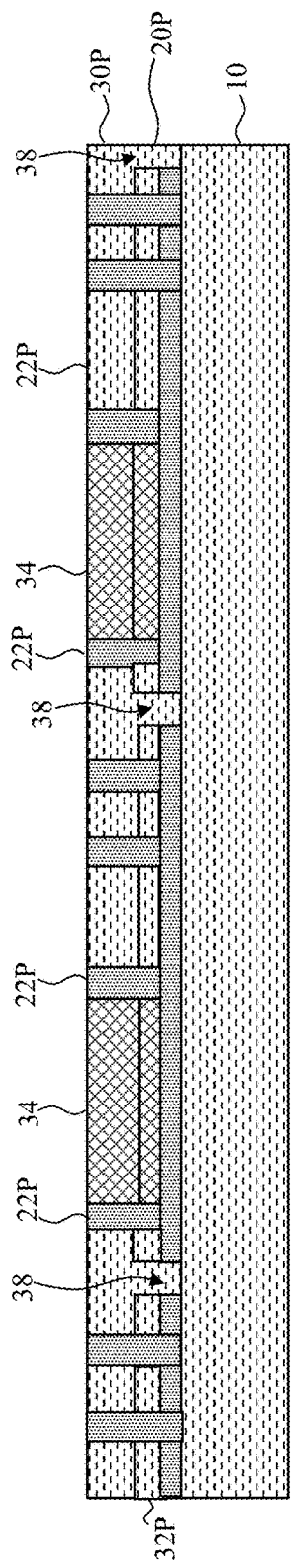
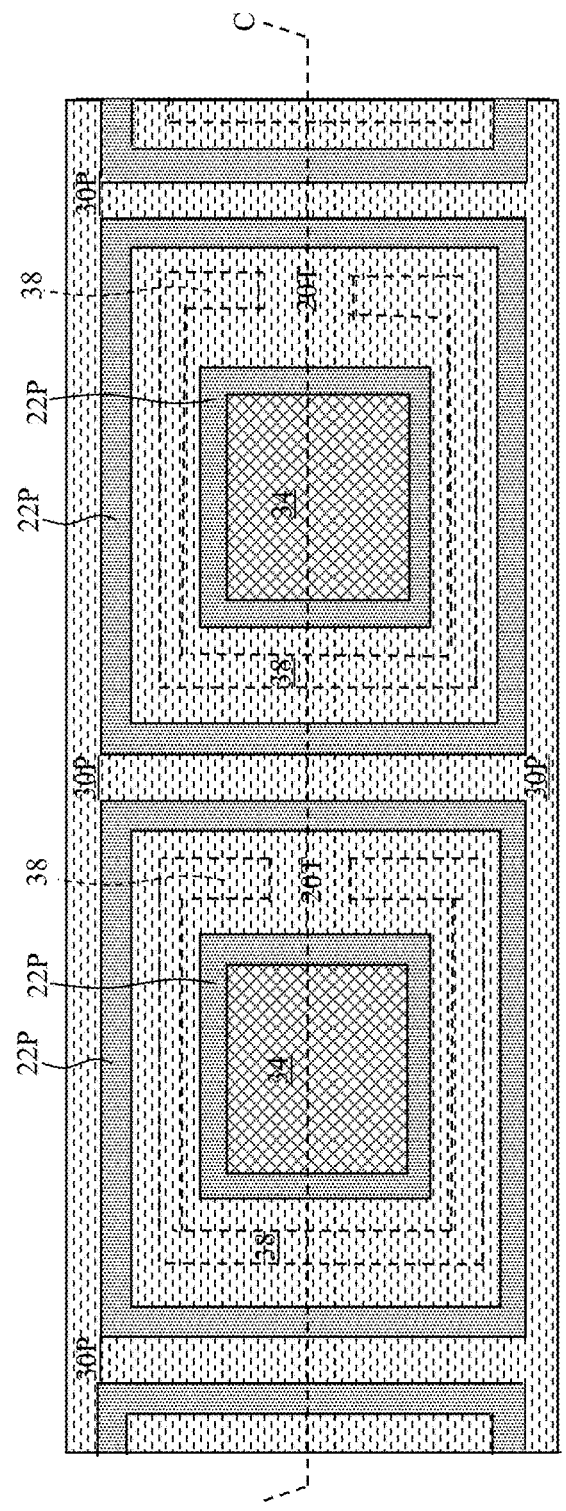
FIG. 25A
FIG. 25B

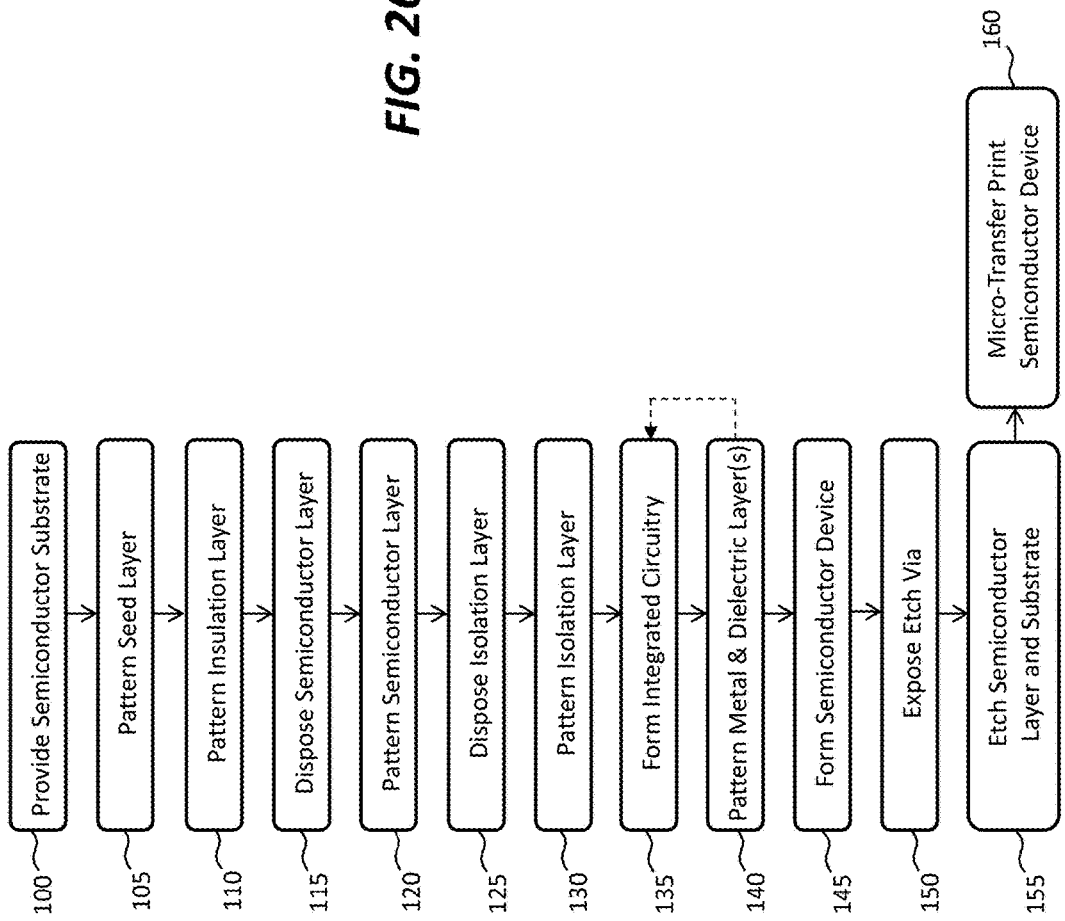

ISOLATION STRUCTURE FOR MICRO-TRANSFER-PRINTABLE DEVICES

PRIORITY APPLICATION

This application claims priority to and benefit of U.S. Patent Application No. 62/436,038, filed Dec. 19, 2016, entitled Isolation Structure for Micro-Transfer Printable Devices, the content of which is hereby incorporated by reference in its entirety.

FIELD OF THE INVENTION

The present invention relates to structures and methods for providing micro-transfer printable integrated circuits on semiconductor substrates using isolation structures.

BACKGROUND OF THE INVENTION

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit.

In some applications, the bare integrated circuit dies are not separately packaged but are placed on a destination substrate and electrically connected on the destination substrate, for example using photolithographic or printed-circuit board methods, to form an electronic system. However, this can be difficult to accomplish when the integrated circuits are small. Thus, an efficient method of transferring bare dies from a relatively small and expensive source substrate (e.g., crystalline semiconductor) to a relatively large and inexpensive destination substrate (e.g., amorphous glass or plastic) is very desirable, since the integrated circuits can provide much higher data processing efficiency than thin-film semiconductor structures formed on large substrates.

One approach to handling and placing small integrated circuits (chiplets) uses micro-transfer printing, for example as described in U.S. Pat. Nos. 8,722,458, 7,622,367 and 8,506,867, each of which is hereby incorporated by reference in its entirety. In these methods, an integrated circuit is formed on a source wafer, for example a semiconductor wafer, and undercut by etching a gap between a bottom side of the integrated circuit and the wafer. A stamp contacts a top side of the integrated circuit to adhere the integrated circuit to the stamp, the stamp and integrated circuit are transported to a destination substrate, for example a glass or plastic substrate, the integrated circuit is contacted and adhered to the destination substrate, and the stamp removed to "print" the integrated circuit from the source wafer to the destination substrate. Multiple integrated circuits can be "printed" in a common step with a single stamp. The integrated circuits can then be electrically connected using conventional photolithographic and printed-circuit board methods. This technique has the advantage of locating many (e.g., tens of thousands to millions) small integrated circuit devices on a destination substrate in a single print step. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

The micro-transfer printing process requires constructing releasable (micro-transfer printable) integrated circuits on a source substrate. The releasable integrated circuits are typically formed using photolithographic methods and materials. There is a need, however, for improvements in processes and structures for making robust releasable integrated circuit in a reliable, efficient, and cost-effective manner.

SUMMARY OF THE INVENTION

In an embodiment of the present invention, a semiconductor structure suitable for micro-transfer printing includes a semiconductor substrate and a patterned insulation layer disposed on or over the semiconductor substrate. The insulation layer pattern defines one or more etch vias in contact with the semiconductor substrate. Each etch via is exposed. A semiconductor device is disposed on the patterned insulation layer and is surrounded by an isolation material in one or more isolation vias that are adjacent to the etch via. The etch via can be at least partially filled with a semiconductor material that is etchable with a common etchant as the semiconductor substrate. Alternatively, the etch via is empty and the semiconductor substrate is patterned to form a gap that separates at least a part of the semiconductor device from the semiconductor substrate and forms a tether physically connecting the semiconductor device to an anchor portion of the semiconductor substrate or the patterned insulation layer.

In an embodiment, the isolation material and the insulation layer include the same material. In another embodiment, the semiconductor substrate and the semiconductor device include at least some of the same materials.

The semiconductor substrate can include a plurality of isolation vias surrounding a corresponding plurality of semiconductor devices with each isolation via adjacent to an etch via. In one configuration, a different etch via is adjacent to each semiconductor device. In another configuration, a common etch via is adjacent to two or more semiconductor devices. In one embodiment, the etch via is surrounded by the patterned insulation layer to form a surrounding anchor structure. In another embodiment, the anchor structure is substantially linear. The etch via can be at least partially filled with a semiconductor material that is etchable with a common etchant that etches the semiconductor substrate. Alternatively, the etch via can be empty and the semiconductor substrate is patterned to form a gap that separates at least a part of the semiconductor device from the semiconductor substrate and forms a tether physically connecting the semiconductor device to an anchor portion of the semiconductor substrate or the patterned insulation layer.

In various configurations, the semiconductor device is an integrated circuit, is a light-emitting diode, includes a diode, or includes a transistor. The semiconductor device can have a length or width less than or equal to 1000 microns, less than or equal to 750 microns, less than or equal to 500 microns, less than or equal to 250 microns, less than or equal to 100 microns, less than or equal to 50 microns, less than or equal to 20 microns, less than or equal to 10 microns, less than or equal to 5 microns, or less than or equal to 2 microns. In other embodiments, the semiconductor device is larger, for example having a size of up to 300 microns by 80 microns or 500 microns by 150 microns, or having a length or width of 500 microns, 750 microns, or 1,000 microns.

A method of making a semiconductor structure suitable for micro-transfer printing, according to embodiments of the present invention, includes providing a semiconductor substrate having an insulation layer on or over the semiconductor substrate and a base semiconductor layer on or over the insulation layer. The base semiconductor layer and the insulation layer are patterned to expose a portion of the semiconductor substrate through a corresponding etch via. Semiconductor material is disposed over the base semiconductor layer and in the etch via to form a second semiconductor layer so that the semiconductor material is in contact with the semiconductor substrate in the etch via and the etch via is at least partially filled with the semiconductor material. An isolation via is formed adjacent to the etch via through the semiconductor material and isolation material disposed in at least each isolation via. A semiconductor device is formed or constructed in or on the semiconductor material (including either or both of the first and second semiconductor layers) and is surrounded by isolation material in a direction parallel to the semiconductor substrate. The semiconductor material in the etch via is exposed and the semiconductor material in the etch via and an associated portion of the semiconductor substrate are etched in a common step with a common etchant to undercut the semiconductor device and form a tether attaching the semiconductor device to an anchor portion of the insulation layer or semiconductor substrate, thereby constructing a micro-transfer printable semiconductor device.

The step of processing the semiconductor material to form a semiconductor device can include disposing and patterning one or more dielectric or electrically conductive layers. The etch via can be exposed by patterning one or more of the dielectric or electrically conductive layers or the etch via is exposed by processing the semiconductor layer to form a semiconductor device.

The step of disposing isolation material in at least each isolation via can include a blanket deposition of isolation material that extends on or over the semiconductor material and that is then patterned to expose at least a portion of the semiconductor material.

In a further embodiment of the present invention, the semiconductor device is micro-transfer printed from the semiconductor substrate to a destination substrate.

The present invention provides structures and methods for efficiently forming robust releasable integrated circuits for micro-transfer printing in a cost-effective manner. Furthermore, when compared to other manufacturing methods, the present invention enables higher resolution tethers that are more easily made because the tether structures are constructed early in the process before the semiconductor devices are formed. The semiconductor devices are also more robust and less prone to process difficulties because the number of process steps performed to make a micro-transfer printable device after the device is constructed is consequently reduced. Furthermore, semiconductor devices made according to methods of the present invention can be arranged at a higher density on a wafer since multiple etching operations are unnecessary after the semiconductor devices are constructed, providing a more efficient and cost-effective use of expensive wafers.

In one aspect, the disclosed technology includes a method of making a semiconductor structure suitable for micro-transfer printing, including: providing a semiconductor substrate having an insulation layer on or over the semiconductor substrate and a base semiconductor layer on or over the insulation layer; patterning the base semiconductor layer and the insulation layer to expose a portion of the semiconductor substrate through a corresponding etch via; disposing semiconductor material over the base semiconductor layer and in the etch via so that the semiconductor material is in contact with the semiconductor substrate in the etch via and the etch via is at least partially filled with the semiconductor material; forming an isolation via over the insulation layer through the semiconductor material and the base semiconductor layer; disposing isolation material in at least each isolation via; forming a semiconductor device in or on the semiconductor material, the semiconductor device surrounded by isolation material in a direction parallel to the semiconductor substrate; exposing the semiconductor material in the etch via; and etching the semiconductor material in the etch via and an associated portion of the semiconductor substrate in a common step to undercut the semiconductor device and form one or more tethers attaching the semiconductor device to an anchor portion of the insulation layer or semiconductor substrate, thereby constructing a micro-transfer printable semiconductor device.

In certain embodiments, the step of forming the semiconductor device includes disposing and patterning one or more dielectric or electrically conductive layers.

In certain embodiments, the step of exposing the etch via is performed by patterning one or more of the dielectric or electrically conductive layers or wherein the step of exposing the etch via is performed by the step of processing the semiconductor material to form a semiconductor device.

In certain embodiments, the step of disposing isolation material in at least each isolation via includes a blanket deposition of isolation material that extends on or over the semiconductor material.

In certain embodiments, the method includes patterning the isolation material to expose at least a portion of the semiconductor material.

In certain embodiments, the method includes micro-transfer printing the semiconductor device from the semiconductor substrate to a destination substrate.

In certain embodiments, the method includes patterning the insulation layer in a pattern different from the base semiconductor layer to form a tether structure or an anchor structure.

In another aspect, the disclosed technology includes a semiconductor structure suitable for micro-transfer printing, including: a semiconductor substrate; a patterned insulation layer disposed on or over the semiconductor substrate, the insulation layer pattern defining one or more exposed etch vias in contact with the semiconductor substrate; and a semiconductor device disposed on the patterned insulation layer, at least a portion of the semiconductor device is surrounded by an isolation material in one or more isolation vias, and the one or more isolation vias are adjacent to the etch via.

In certain embodiments, the insulation layer and the isolation material are or include the same material or wherein the insulation layer and the isolation material are dielectric materials, are silicon oxide or silicon nitride.

In certain embodiments, the semiconductor substrate and the semiconductor material are or include the same material or wherein the semiconductor substrate and the semiconductor material are silicon, silicon <111>, or silicon <100>.

In certain embodiments, the semiconductor structure includes a plurality of isolation vias surrounding a corresponding plurality of semiconductor devices, each isolation via adjacent to an etch via.

In certain embodiments, a different etch via contacts the semiconductor substrate for etching each semiconductor device.

In certain embodiments, a common etch via contacts the semiconductor substrate for etching two or more semiconductor devices.

In certain embodiments, the etch via is at least partially filled with a semiconductor material that is etchable with a common etchant as the semiconductor substrate.

In certain embodiments, the etch via is empty and the semiconductor substrate is patterned to form a gap that separates at least a part of the semiconductor device from the semiconductor substrate and forms one or more tethers physically connecting the semiconductor device to an anchor portion of the semiconductor substrate or the patterned insulation layer.

In certain embodiments, the semiconductor device is an integrated circuit, is a light-emitting diode, includes a diode, or includes a transistor.

In certain embodiments, the semiconductor device has a length or width less than or equal to 250 microns, less than or equal to 100 microns, less than or equal to 50 microns, less than or equal to 20 microns, less than or equal to 10 microns, less than or equal to 5 microns, or less than or equal to 2 microns, and greater than zero microns.

In certain embodiments, the semiconductor device has a thickness or depth less than or equal to one micron, two microns, five microns, ten microns, twenty microns, or fifty microns and greater than zero microns.

In certain embodiments, the one or more tethers comprise a buried oxide layer in a silicon on insulator substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 10A and 10B illustrate a cross section and corresponding plan view, respectively, of an embodiment of the present invention;

FIGS. 15A and 15B illustrate a cross section and corresponding plan view, respectively, of successive sequential steps in another method of the present invention;

FIGS. 19A and 19B illustrate a cross section and corresponding plan view, respectively, of a step in another method of the present invention;

FIGS. 20A and 20B illustrate a cross section and corresponding plan view, respectively, of a step in another method of the present invention;

FIGS. 23A and 23B also illustrate a cross section and corresponding plan view, respectively, of embodiments of the present invention;

FIGS. 24A and 24B also illustrate a cross section and corresponding plan view, respectively, of embodiments of the present invention;

FIGS. 25A and 25B also illustrate a cross section and corresponding plan view, respectively, of embodiments of the present invention;

FIG. 26 is a flow chart illustrating methods of the present invention;

Figure 1A:
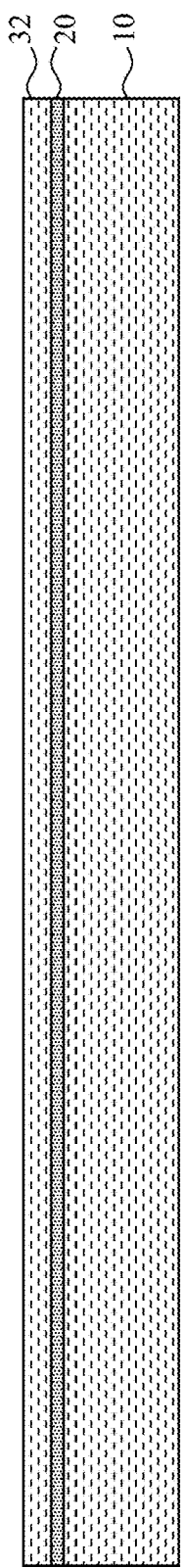
FIGS. 1A and 1B illustrate a cross section and corresponding plan view, respectively, of a step in successive sequential steps of a method of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Embodiments of the present invention provide structures and methods for efficiently forming robust releasable integrated circuits for micro-transfer printing in a cost-effective manner. The integrated circuits are surrounded by an isolation layer that provides environmental and electrical protection to the device. Methods of the present invention provide reduced processing steps to make such robust releasable or released integrated circuits suitable for micro-transfer printing using a stamp. Moreover, embodiments of the present invention provide structures and methods to enable micro-transfer printing from devices formed on alternative substrates or disposed on handle substrates that include materials different from materials in the integrated circuits.

FIGS. 1-11 illustrate successive sequential steps and structures for making embodiments of the present invention. Each Figure includes a plan view from the top (B) and a corresponding cross section (A) taken across the cross-section line C of the plan view B.

Figure 1B:
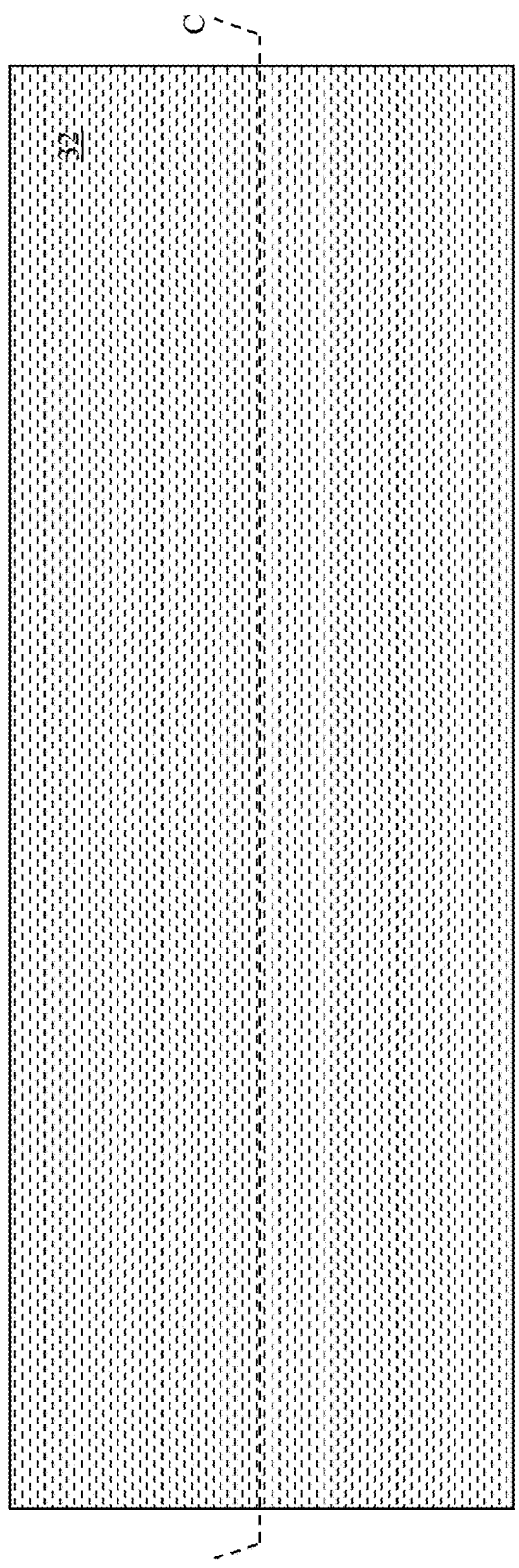

Referring to FIGS. 1-11, A and B, and to the flow chart of FIG. 26, a method of making a semiconductor structure suitable for micro-transfer printing according to embodiments of the present invention includes providing in step 100 a semiconductor substrate 10 having an insulation layer 20 on, over, or in direct physical contact with the semiconductor substrate 10 and a base semiconductor layer 32 on, over, or in direct physical contact with the insulation layer 20 (FIGS. 1A, 1B). The semiconductor substrate 10 can be provided and an insulating layer 20 formed over the semiconductor substrate 10. Similarly, the semiconductor substrate 10 can be provided with an insulating layer 20 formed over the semiconductor substrate 10 and a base semiconductor layer 32 formed over the insulating layer 20. In an embodiment, the semiconductor structure provided in step 100 is a silicon-on-insulator (SOI) wafer. The semiconductor substrate 10 can be, for example, a semiconductor, a silicon semiconductor, silicon <100>, or silicon <111>. The base semiconductor layer 32 can be a crystalline, an amorphous, or polycrystalline semiconductor layer (e.g. a silicon layer) and have a thickness less than or equal to twenty microns, less than or equal to ten microns, less than or equal to five microns, one micron, 0.5 microns, 0.3 microns, 0.25 microns, 0.1 microns, or 0.05 microns. The insulation layer 20 can be, for example, a buried oxide (BOx) layer, an oxide layer, a silicon oxide layer, a silicon dioxide layer, a nitride layer, a silicon nitride layer, or a combination of layers having a thickness, for example, of less than or equal to five microns, one micron, 0.5, or 0.25 microns. The insulation layer 20 can be disposed on the semiconductor substrate 10 by, for example, evaporation, sputtering, thermal oxidation, wet thermal oxidation, wafer bonding, or physical bonding. When prepared by wafer bonding, all or part of the insulating layer 20 can be disposed on the layer 32. In an embodiment of the present invention, the base semiconductor layer 32 and the semiconductor substrate 10 can be or include the same material or can be etchable with the same etchant.

If an additional layer is located between the insulation layer 20 and the semiconductor substrate 10 and is etchable with common materials as the semiconductor substrate 10, the additional layer can be considered to be part of the semiconductor substrate 10. If the additional layer is etchable with common materials as the insulation layer 20, the additional layer can be considered to be part of the insulation layer 20. Similarly, if an additional layer is located between the insulation layer 20 and the base semiconductor layer 32 and is etchable with common materials as the insulation layer 20, the additional layer can be considered to be part of the insulation layer 20. If the additional layer is etchable with common materials as the base semiconductor layer 32, the additional layer can be considered to be part of the base semiconductor layer 32.

Figure 2A:
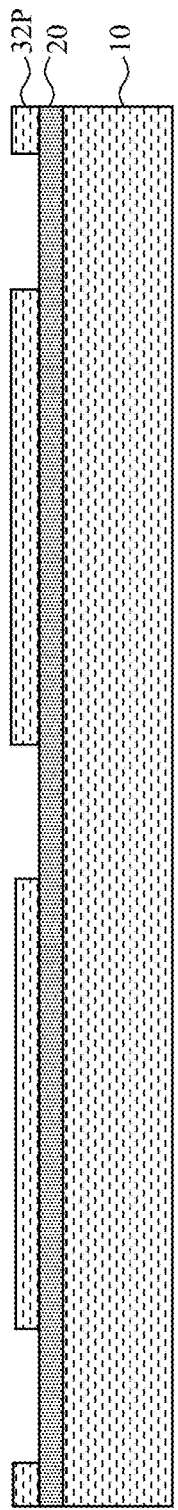
FIGS. 2A and 2B illustrate a cross section and corresponding plan view, respectively, of a step in successive sequential steps of a method of the present invention.
Figure 2B:
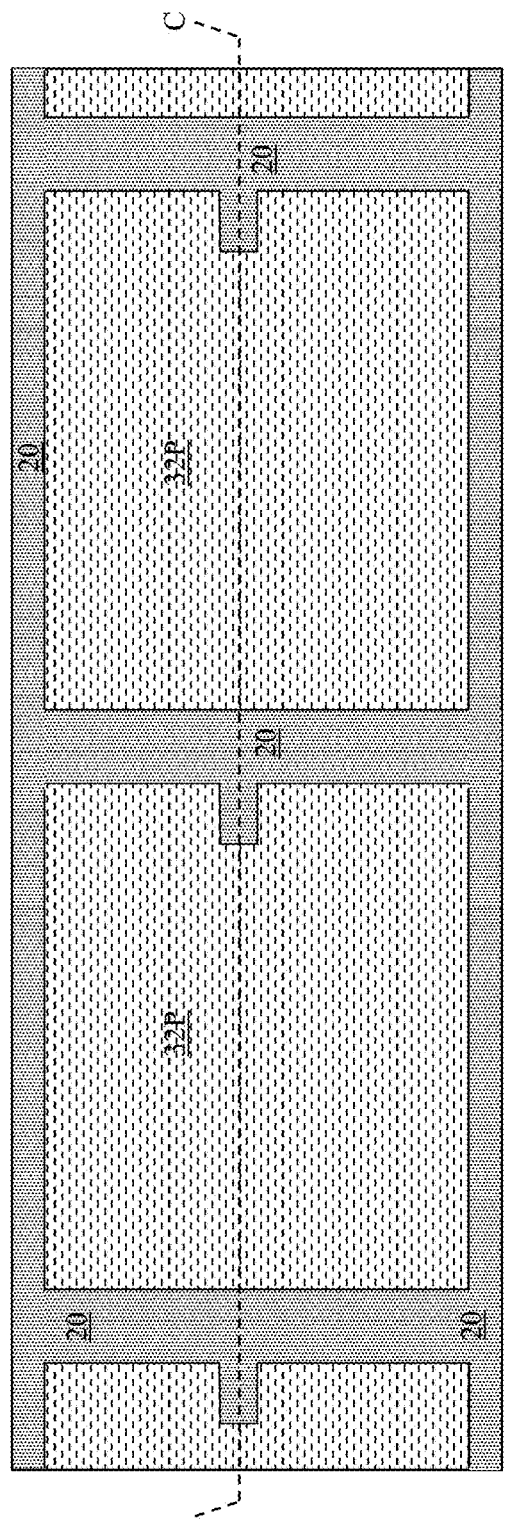

Referring next to FIGS. 2A and 2B, the base semiconductor layer 32 is patterned in step 105 to expose a portion of the insulation layer 20. The exposed portion of the insulation layer 20 can surround (in a horizontal direction parallel to a surface of the semiconductor substrate 10) portions of the patterned base semiconductor material 32P. The subscript 'P' is added to the base semiconductor layer label 32 to indicate that the patterned base semiconductor layer 32P is patterned.

Figure 3A:
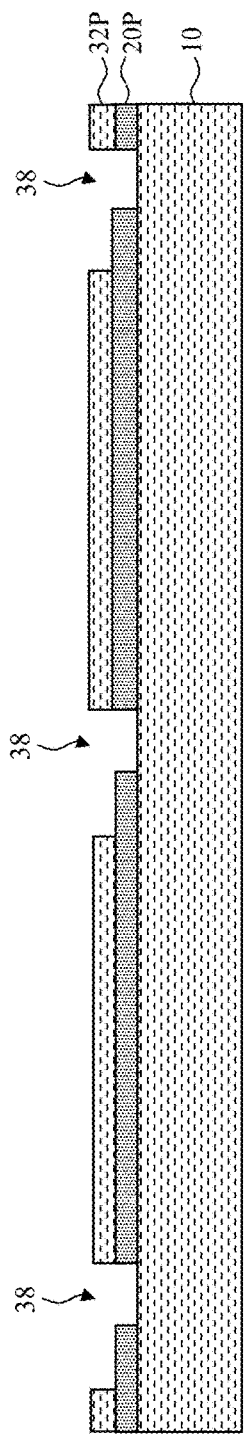
FIGS. 3A and 3B illustrate a cross section and corresponding plan view, respectively, of a step in successive sequential steps of a method of the present invention.
Figure 3B:
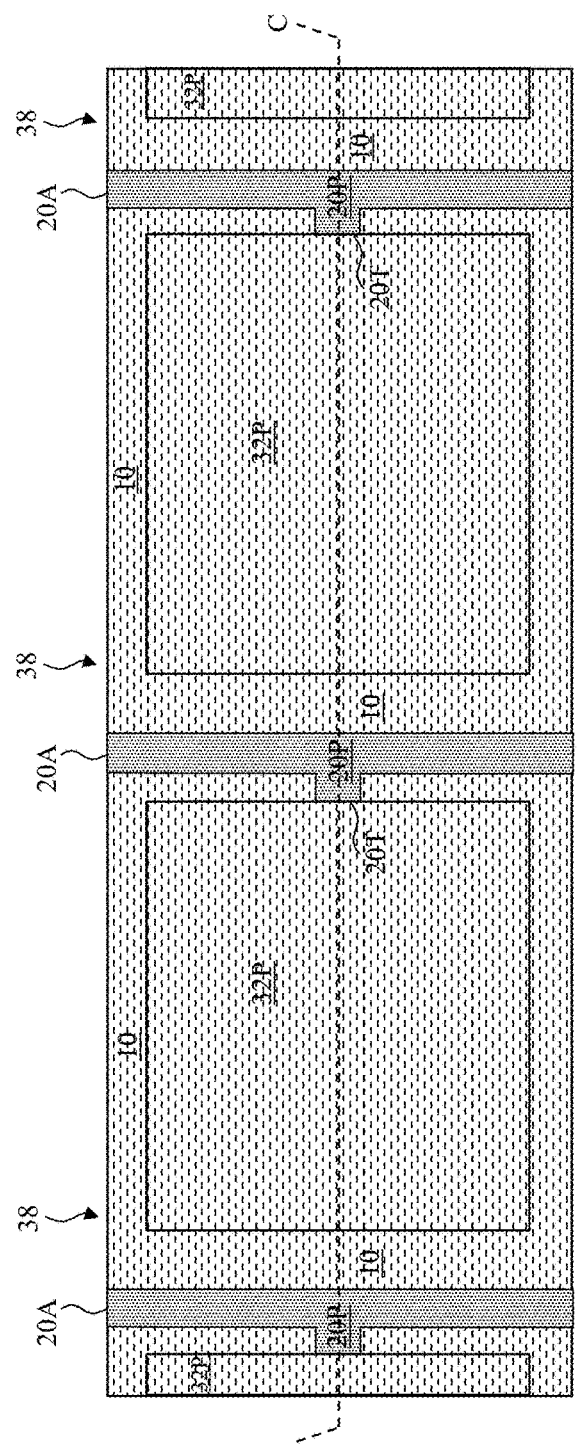

Referring to FIGS. 3A and 3B, the exposed portion of the insulation layer 20 is patterned in step 110 to form etch vias 38 that expose the underlying semiconductor substrate 10. The remaining exposed portion of the insulation layer 20 will form an anchor structure 20A and a tether structure 20T in subsequent process steps. The exposed portion of the semiconductor substrate 10 can surround (in a horizontal direction parallel to a surface of the semiconductor substrate 10) portions of the patterned base semiconductor material 32P except for the tether structure 20T. In this embodiment, the anchor structure 20A is substantially linear. As with the base semiconductor layer 32, the subscript 'P' is added to the insulation layer label 20 to indicate that the patterned insulation layer 20P is patterned. The materials and layers are otherwise unchanged.

Figure 16A:
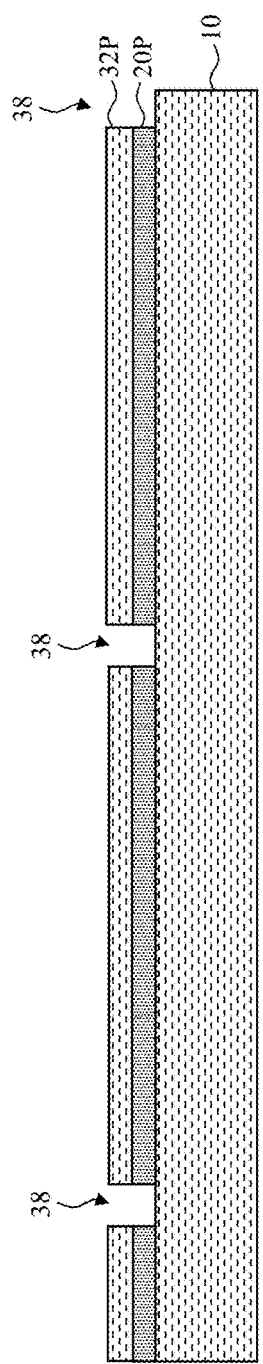
FIGS. 16A and 16B illustrate a cross section and corresponding plan view, respectively, of a step in another method of the present invention.
Figure 16B:
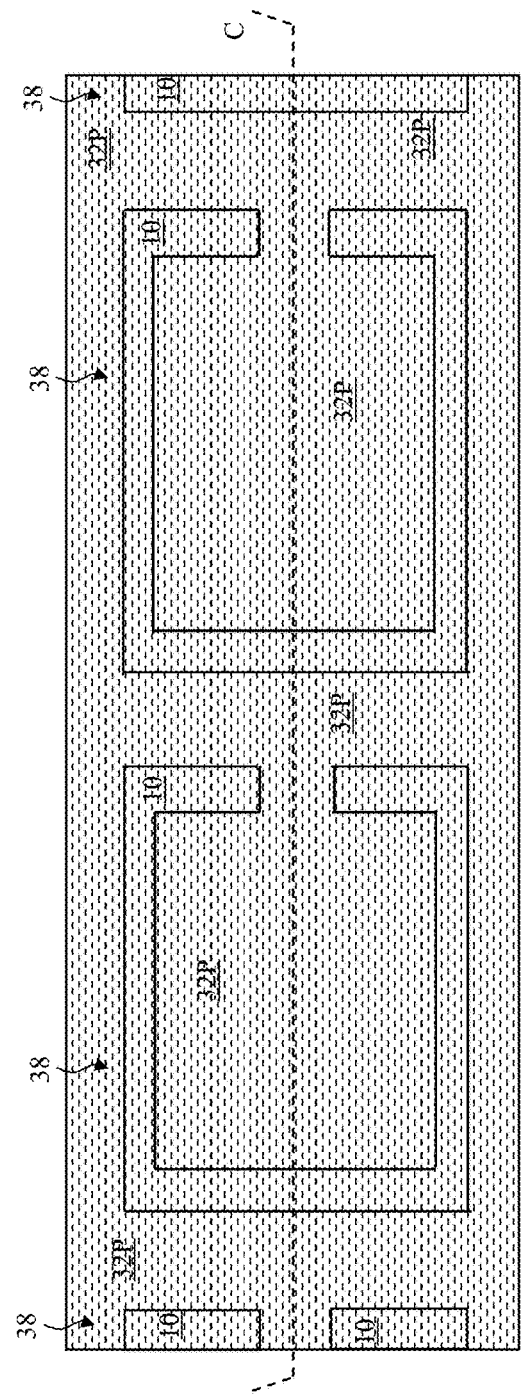
Figure 17A:
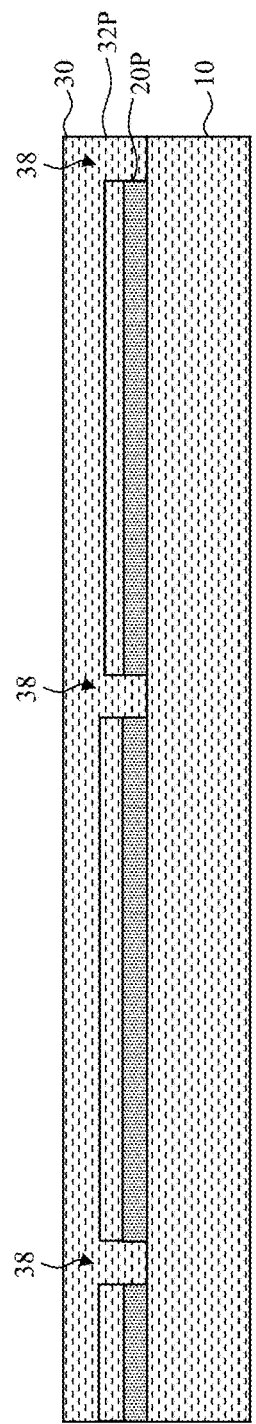
FIGS. 17A and 17B illustrate a cross section and corresponding plan view, respectively, of a step in another method of the present invention.
Figure 17B:
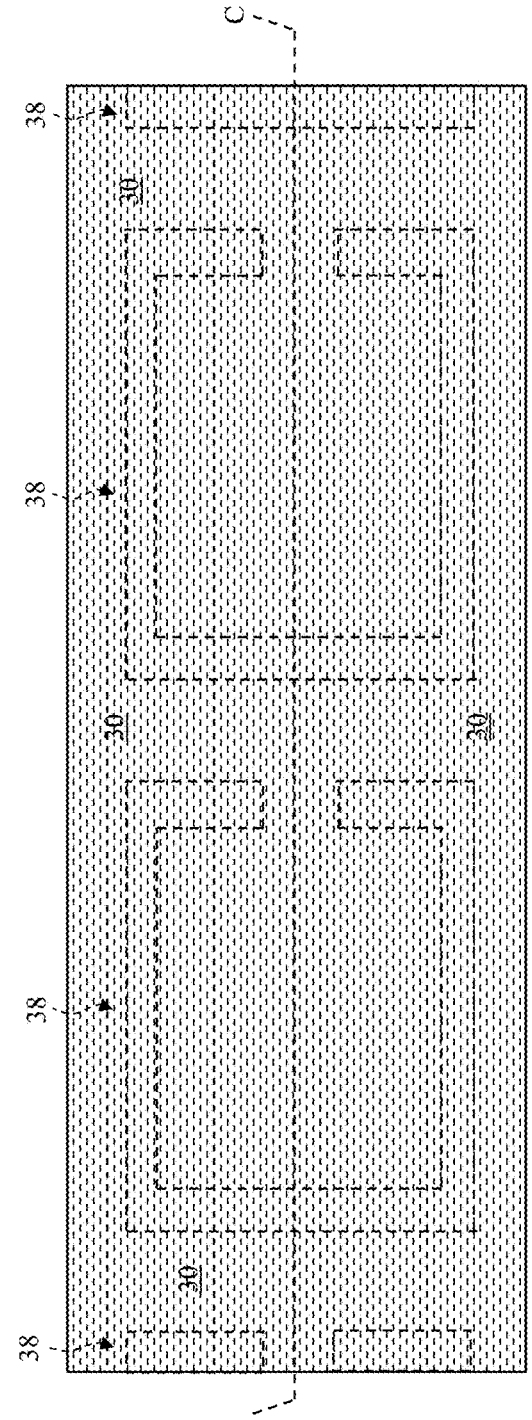
Figure 18A:
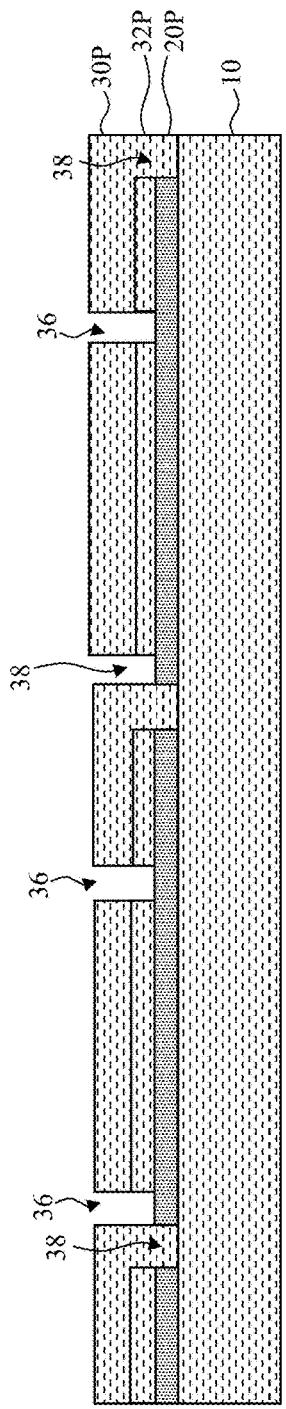
FIGS. 18A and 18B illustrate a cross section and corresponding plan view, respectively, of a step in another method of the present invention.
Figure 18B:
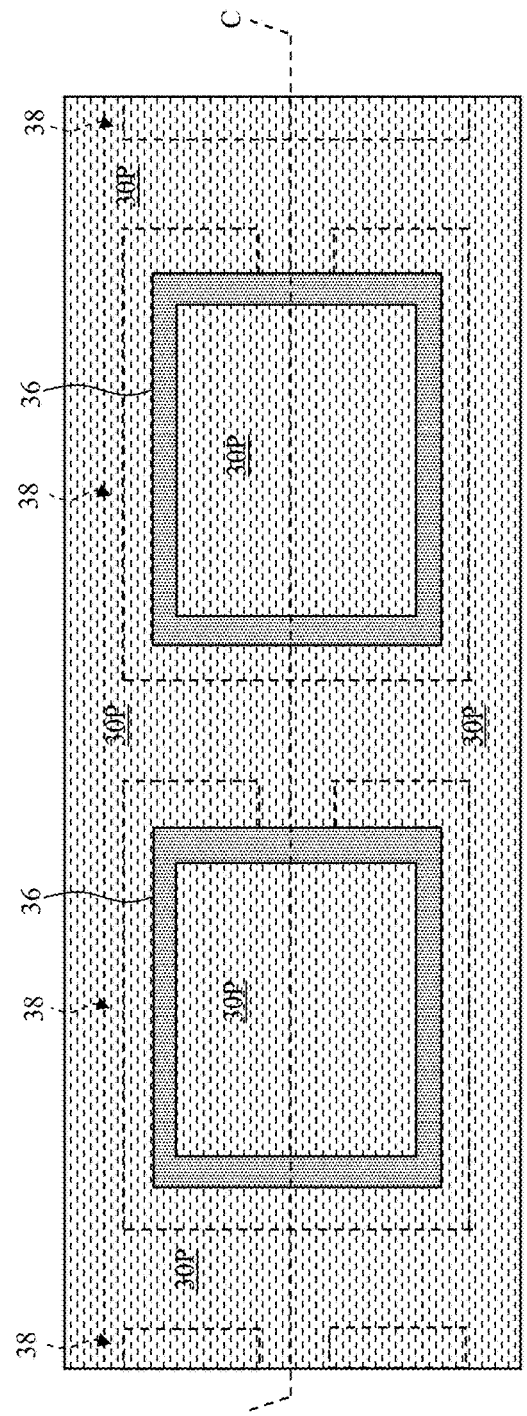
Figure 21A:
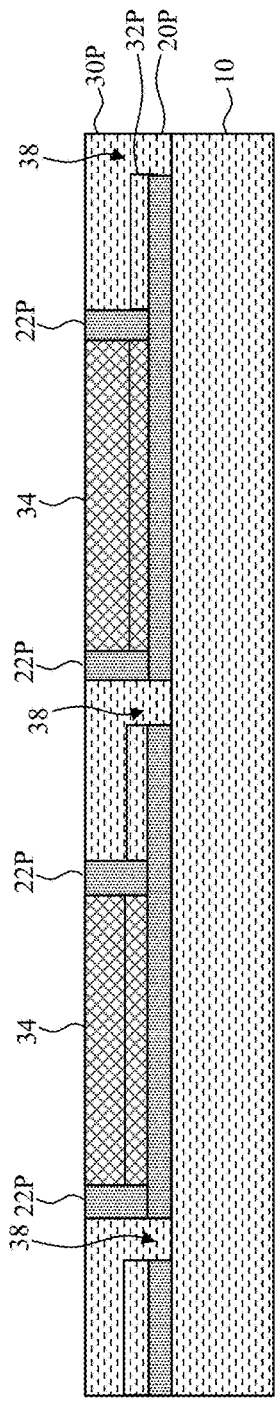
FIGS. 21A and 21B illustrate a cross section and corresponding plan view, respectively, of a step in another method of the present invention.
Figure 21B:
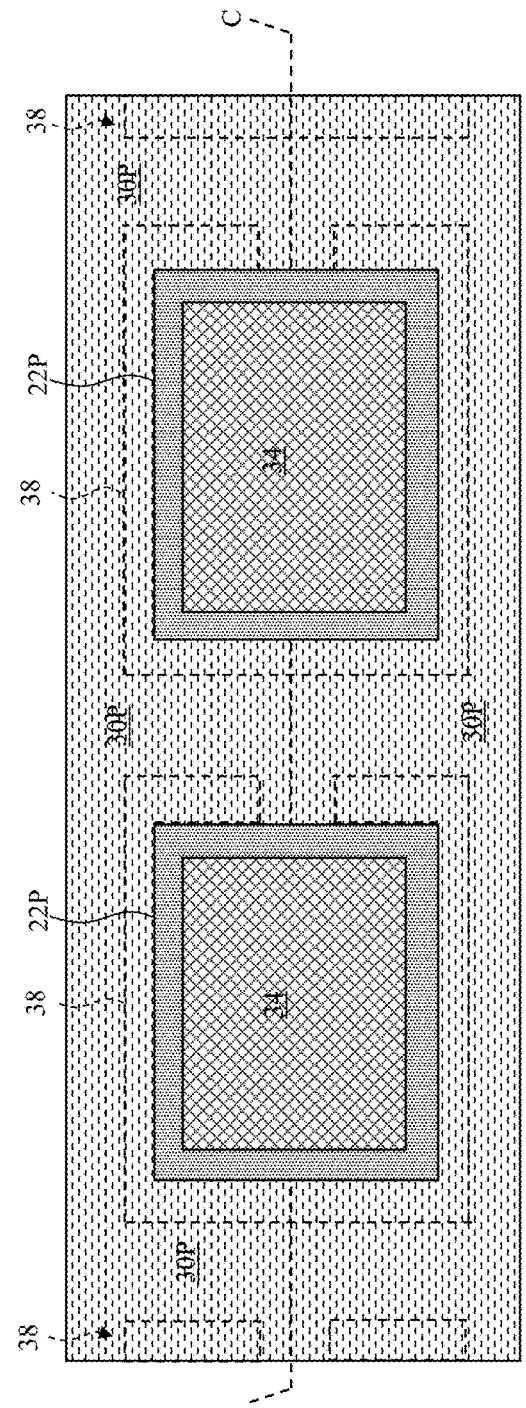
Figure 22A:
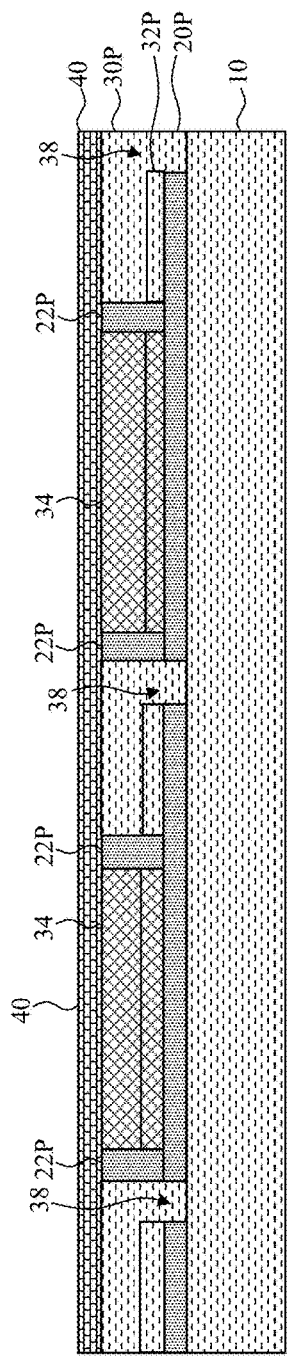
FIGS. 22A and 22B illustrate a cross section and corresponding plan view, respectively, of a step in another method of the present invention.
Figure 22B:
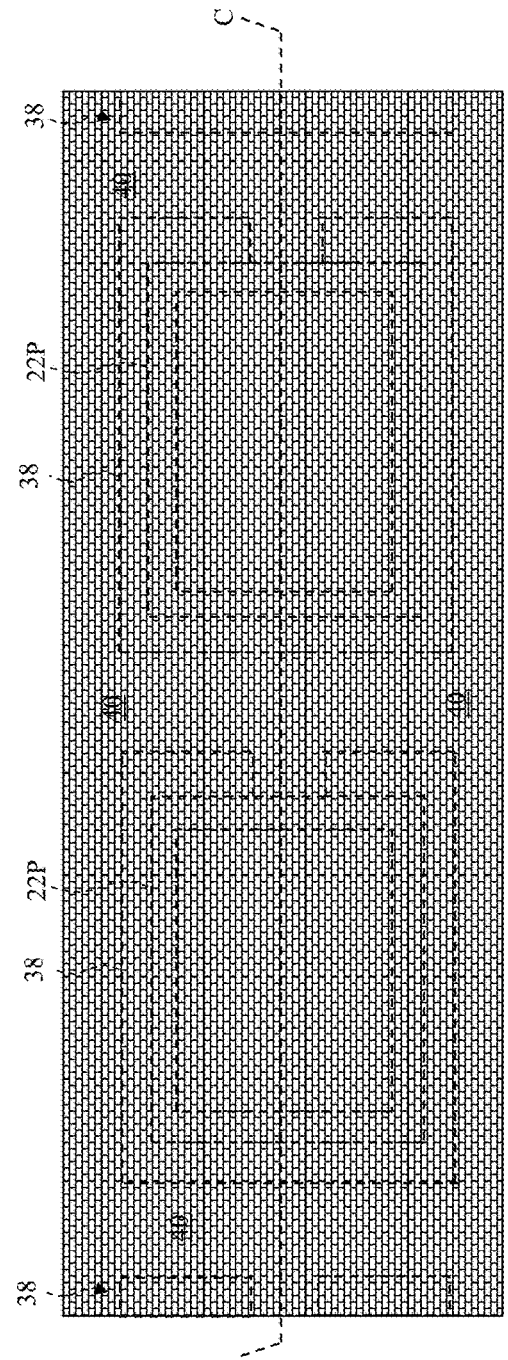

Patterning the base semiconductor layer 32 and the insulation layer 20 and those layers described below can be done with conventional photolithographic methods and materials, for example by coating with a photoresist, pattern-wise exposing and developing the photoresist, etching the patterned photoresist, and stripping the photoresist to make a patterned layer. The insulation layer 20 and the base semiconductor layer 32 can be patterned in separate steps with different etchants and can be patterned into the same pattern (as shown in FIGS. 16A, 16B discussed below), or different patterns, as shown in FIGS. 3A, 3B. For example, an exposed portion of the insulation layer 20 can extend beyond the base semiconductor layer 32P into a portion of the etch via 38. The etch via 38 can be a gap or empty space, as shown in FIGS. 3A and 3B or can be filled with an etchable material. The exposed portion of the semiconductor substrate 10 in the etch vias 38 will enable etching of the semiconductor substrate 10 to undercut a constructed semiconductor device.

Figure 4A:
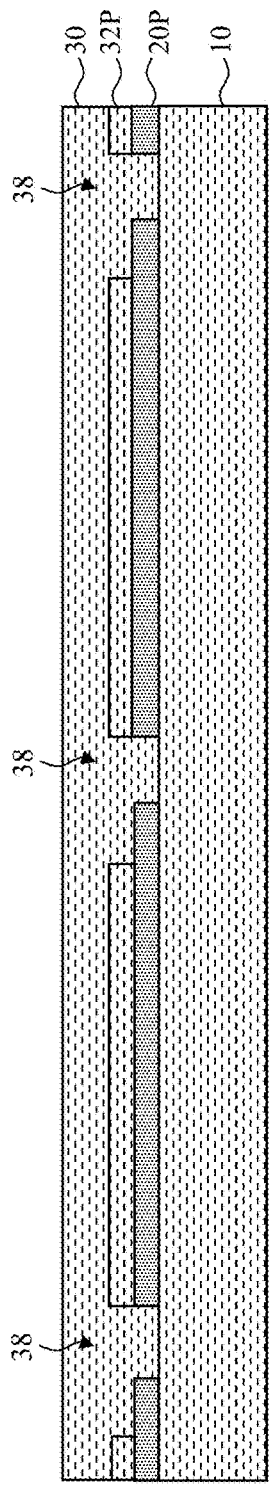
FIGS. 4A and 4B illustrate a cross section and corresponding plan view, respectively, of a step in successive sequential steps of a method of the present invention.
Figure 4B:
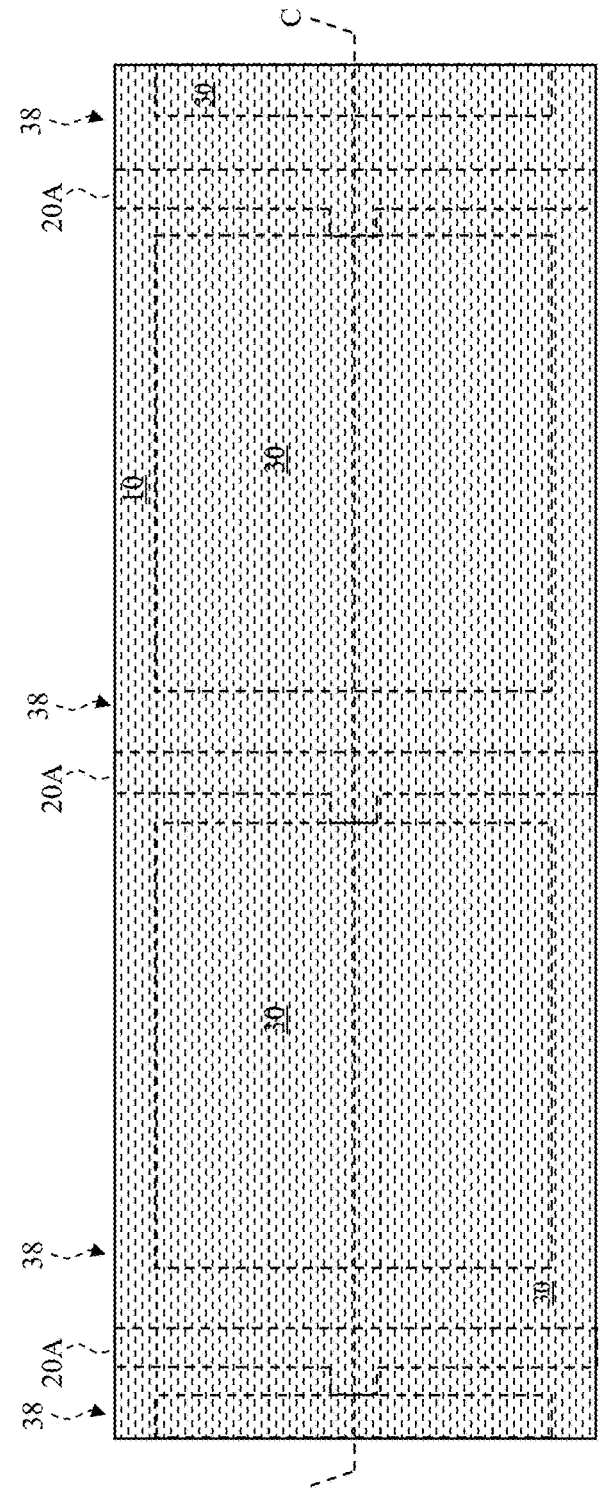

In step 115 and as shown in FIGS. 4A and 4B, a semiconductor material 30 is disposed in a second semiconductor layer 30 on, over, or in contact with the patterned base semiconductor layer 32P, on the exposed patterned insulation layer 20P, and in the etch vias 38 on the exposed portions of the semiconductor substrate 10, for example by CVD, so that the semiconductor material 30 is in contact with the semiconductor substrate 10 in the etch via 38 and the etch via 38 is at least partially filled with the semiconductor material 30. (In FIG. 4B and the plan view Figures following, underlying structures are illustrated with dashed lines to aid in understanding the structure and process.) The second semiconductor layer 30 can be the same material (e.g., silicon) as the patterned base semiconductor layer 32P and the semiconductor substrate 10 and can be etchable with the same etchant. Because the base semiconductor layer 32 can be a crystalline semiconductor, the deposited or epitaxially grown second semiconductor layer 30 can also be a crystalline semiconductor and is not readily physically distinguishable from the patterned base semiconductor layer 32P. Similarly, both of the first and second semiconductor layers 32, 30 could be amorphous or both of the first and second semiconductor layers 32, 30 could be polycrystalline so that the first and second semiconductor layers 32, 30 are not readily distinguishable and can effectively form a single semiconductor layer formed in two separate steps. The layers 32 and 30 can have a wide range of thicknesses, for example less than one micron, 1-10 microns, 10-50 microns, or 50-100 microns, and can have different thicknesses. Nonetheless, in the following figures, the base semiconductor layer 32 and the second semiconductor layer 30 are distinguished with a line and the patterned base semiconductor layer 32P and the patterned second semiconductor layer 30P are distinguished with a line to aid understanding of the process.

Figure 5A:
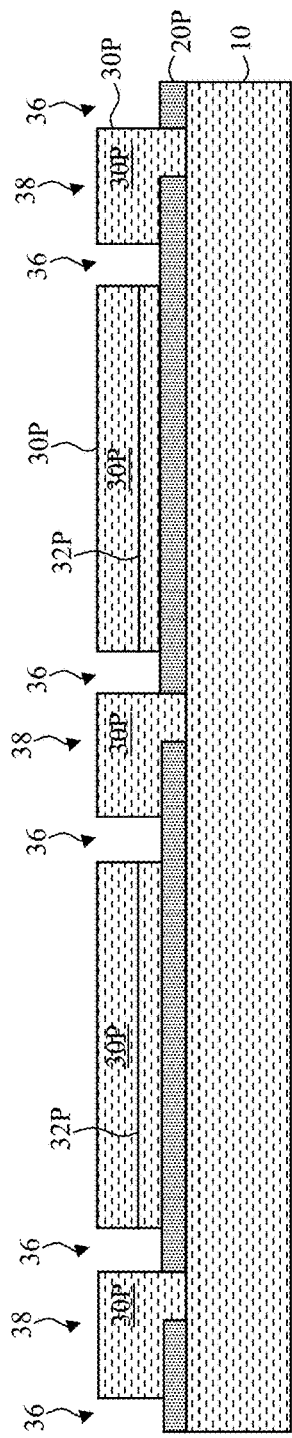
FIGS. 5A and 5B illustrate a cross section and corresponding plan view, respectively, of a step in successive sequential steps of a method of the present invention.
Figure 5B:
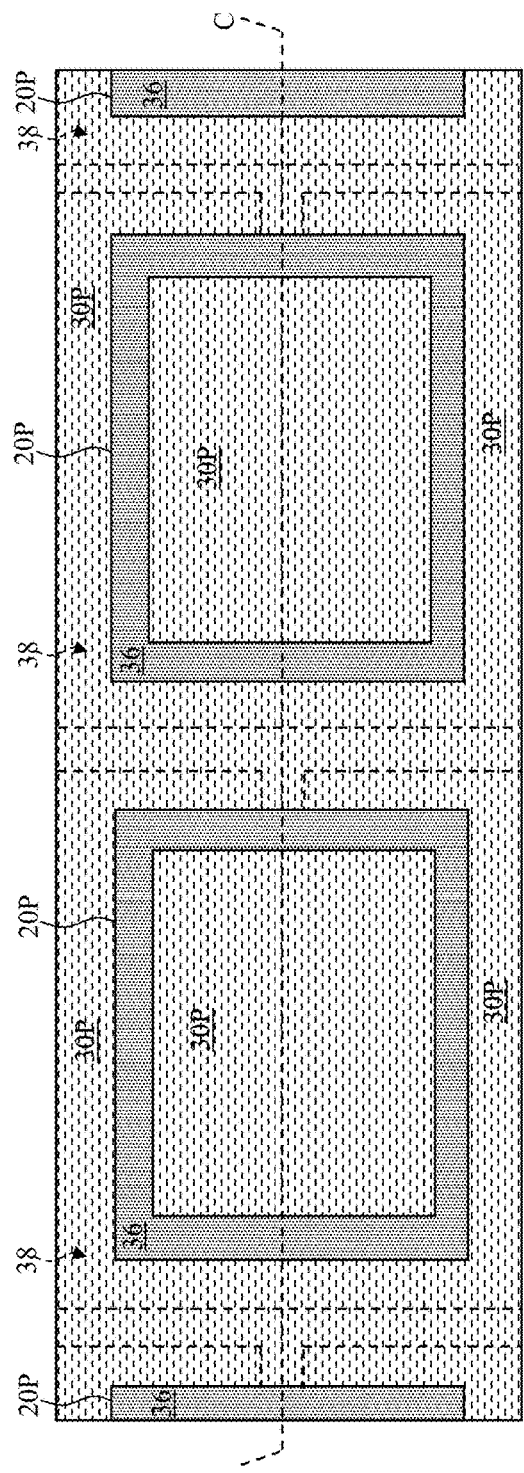

In step 120 and as shown in FIGS. 5A and 5B, the patterned second semiconductor layer 30 and the base semiconductor layer 32P are further patterned to form isolation vias 36 over the patterned insulation layer 20P. The isolation vias 36 are located on either side of the etch vias 38 (the etch vias 38 are now filled with semiconductor material 30). The isolation vias 36 are adjacent to the etch vias 38 and can be horizontally in contact with the etch vias 38 (as shown) or horizontally offset from them (not shown). By adjacent is meant that no other etch, isolation, or integrated circuit structure is formed or located between the adjacent vias and that the etch via 38 is used to etch and undercut the associated semiconductor substrate 10 beneath and between the isolation vias 36, described below. The isolation vias 36 can surround (in a horizontal direction parallel to a surface of the semiconductor substrate 10) portions of the patterned semiconductor material 30P over the patterned base semiconductor layer 32P, as shown in FIG. 5B. Patterning step 120 can be, for example, a shallow or deep trench isolation step. As the etch vias 38 did in FIGS. 3A, 3B, the isolation vias 36 can form a trench, for example a rectangular trench, and separate the surrounded portions of the patterned second semiconductor layer 30P from the material in the etch vias 38.

Figure 6A:
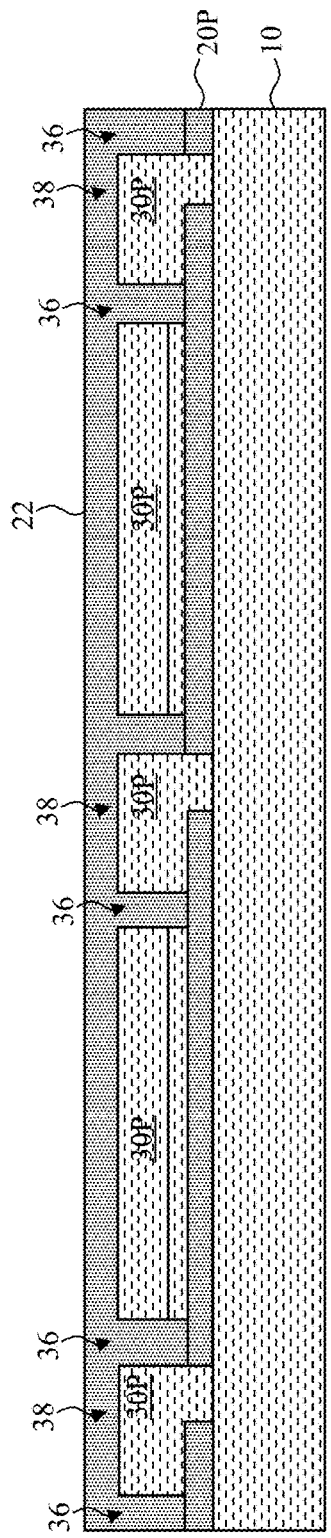
FIGS. 6A and 6B illustrate a cross section and corresponding plan view, respectively, of a step in successive sequential steps of a method of the present invention.
Figure 6B:
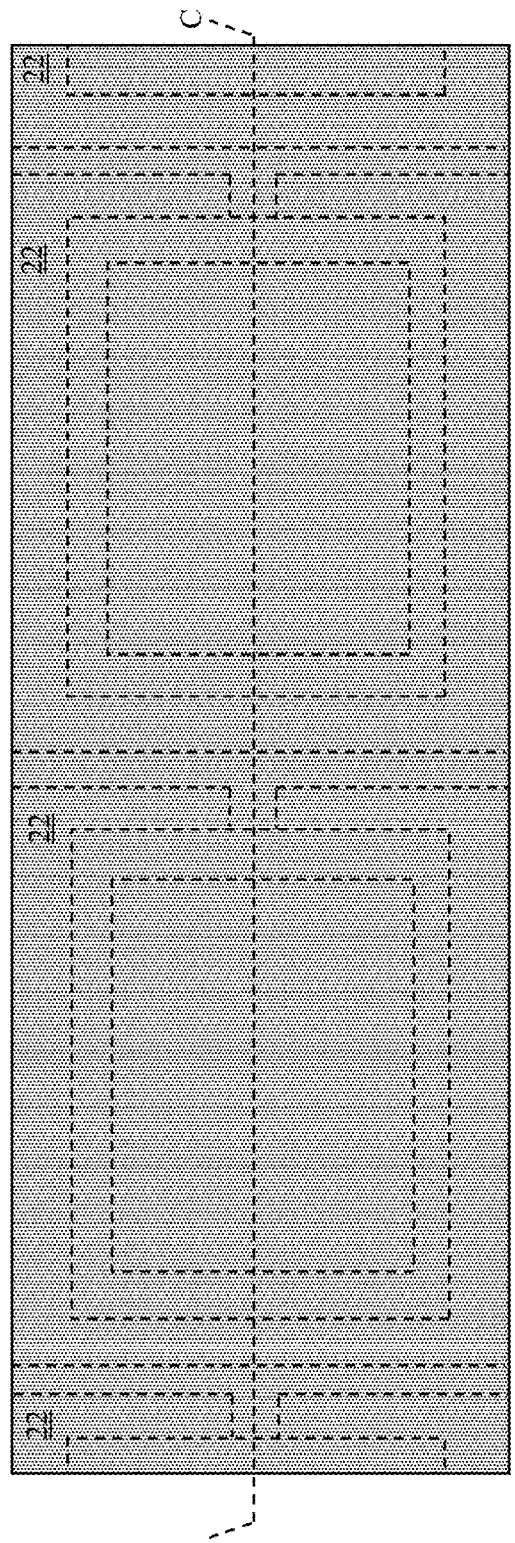
Figure 7A:
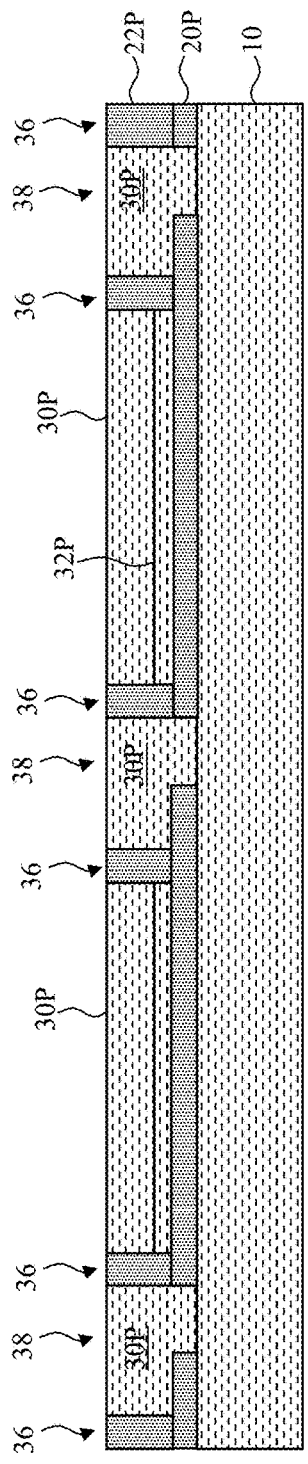
FIGS. 7A and 7B illustrate a cross section and corresponding plan view, respectively, of a step in successive sequential steps of a method of the present invention.
Figure 7B:
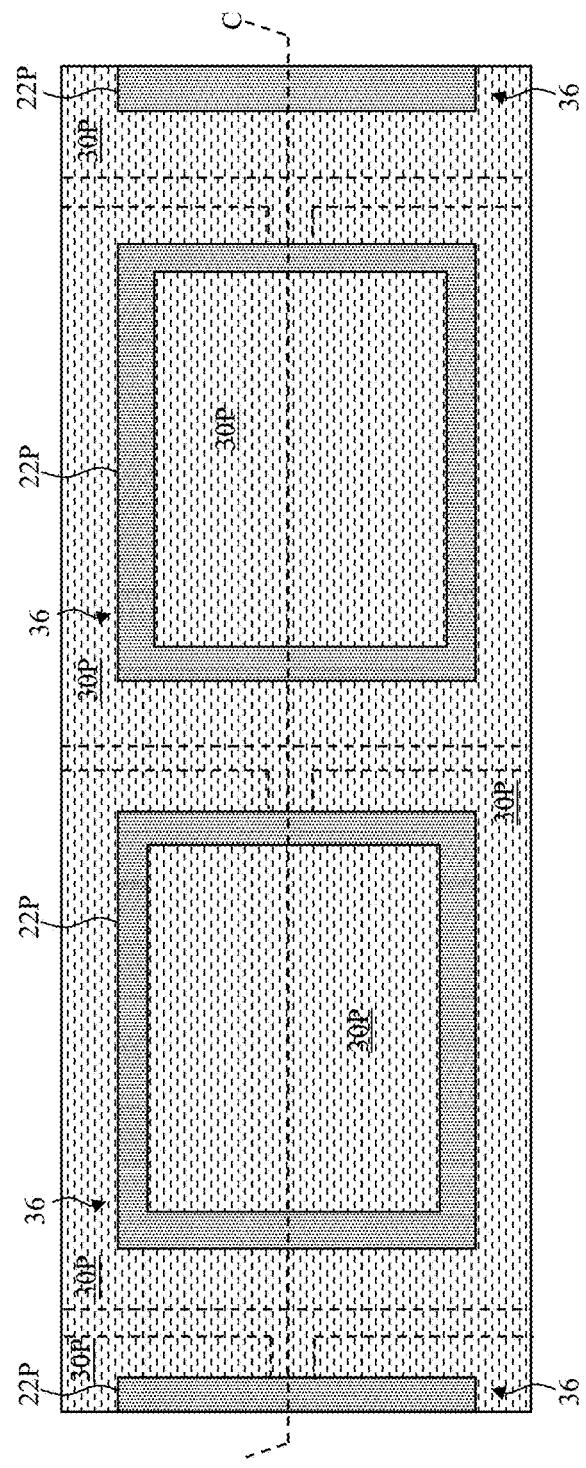

In step 125 and as shown in FIGS. 6A and 6B, an isolation layer 22 of isolation material 22 is disposed, for example by CVD, sputtering, thermal oxidation, or evaporation, at least in each isolation via 36 and can be, for example, a dielectric material such as an oxide, silicon dioxide, a nitride, or silicon nitride, and can be the same material as the insulation layer 20. The isolation material 22 can partially or completely fill the isolation via 36. The isolation material 22 can be, but is not necessarily, a blanket deposition that extends on or over the patterned second semiconductor layer 30P on a side of the patterned second semiconductor layer 30P opposite the semiconductor substrate 10. To remove any isolation material 22 over the patterned second semiconductor layer 30P, the isolation layer 22 can be patterned in step 130 (including by chemical mechanical polishing) and as shown in FIGS. 7A and 7B to form a patterned isolation layer 22P and surround portions of and expose the patterned second semiconductor layer 30P.

Figure 8A:
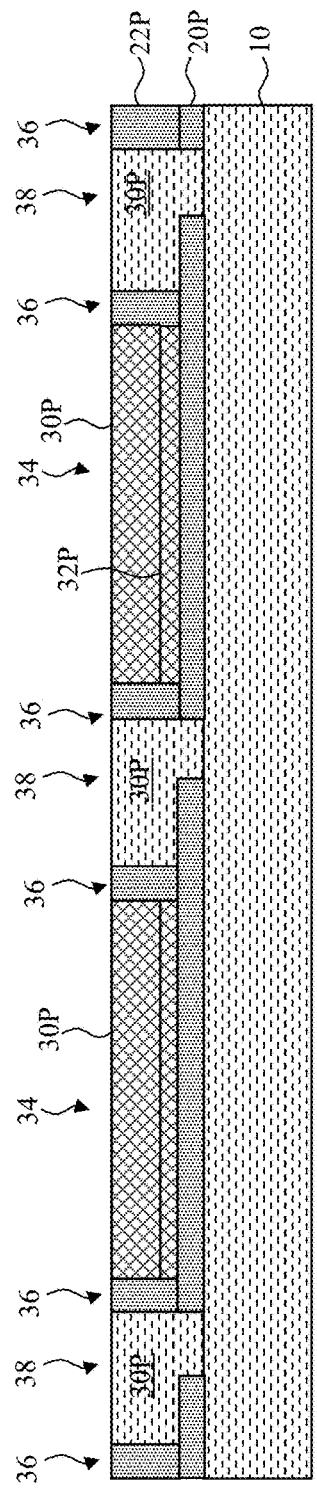
FIGS. 8A and 8B illustrate a cross section and corresponding plan view, respectively, of a step in successive sequential steps of a method of the present invention.
Figure 8B:
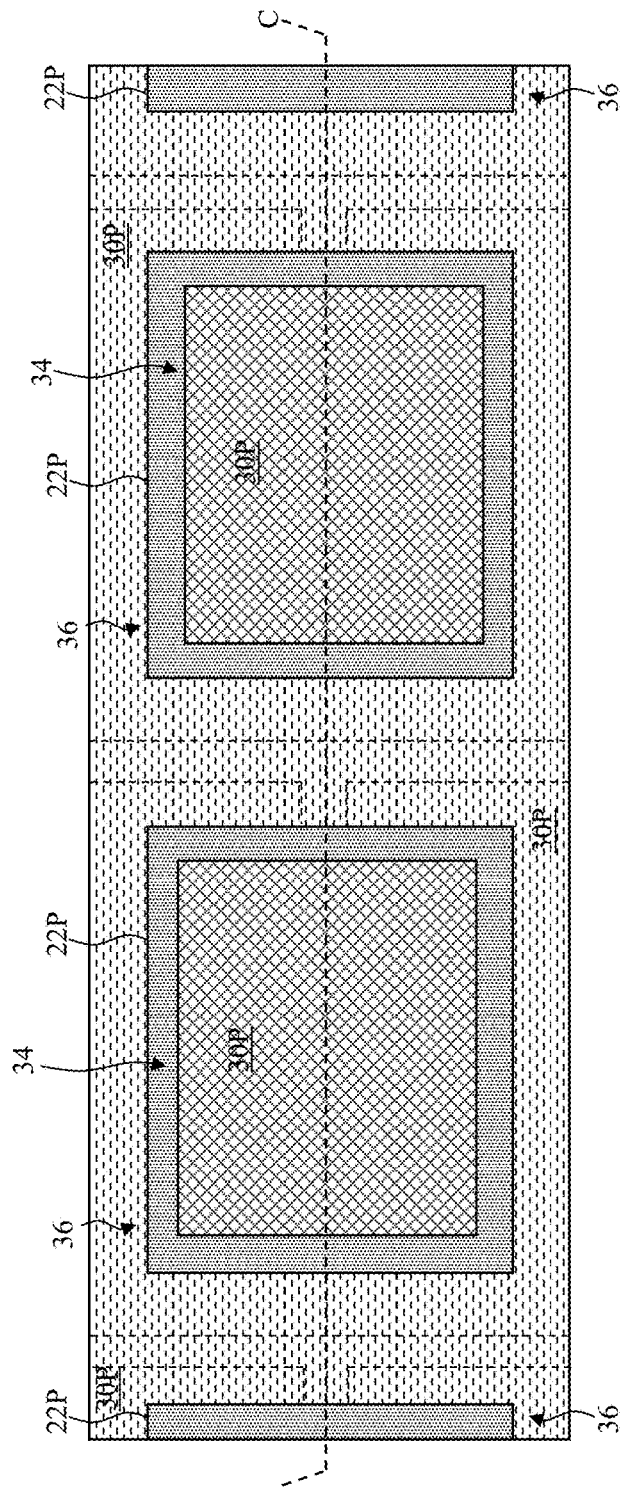
Figure 9A:
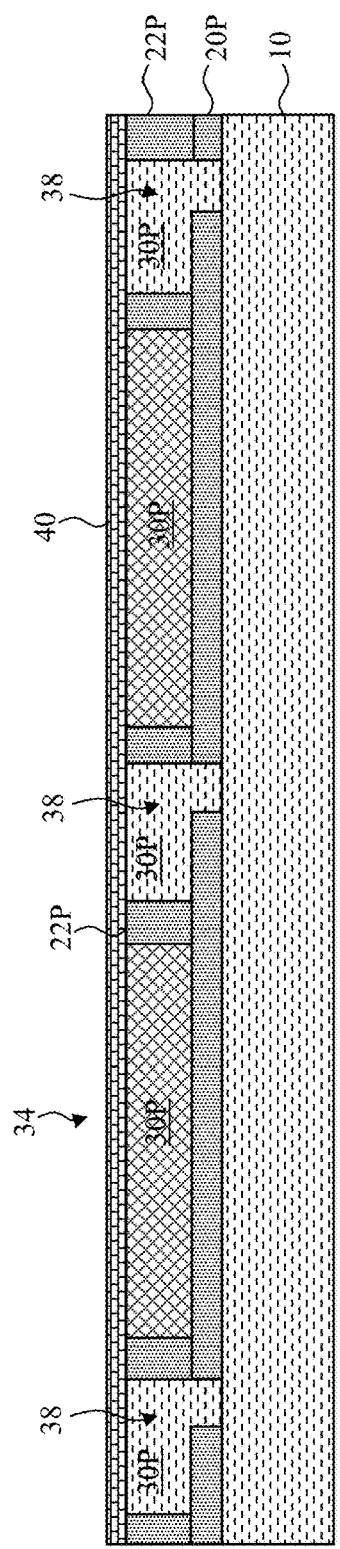
FIGS. 9A and 9B illustrate a cross section and corresponding plan view; respectively, of a step in successive sequential steps of a method of the present invention.
Figure 9B:
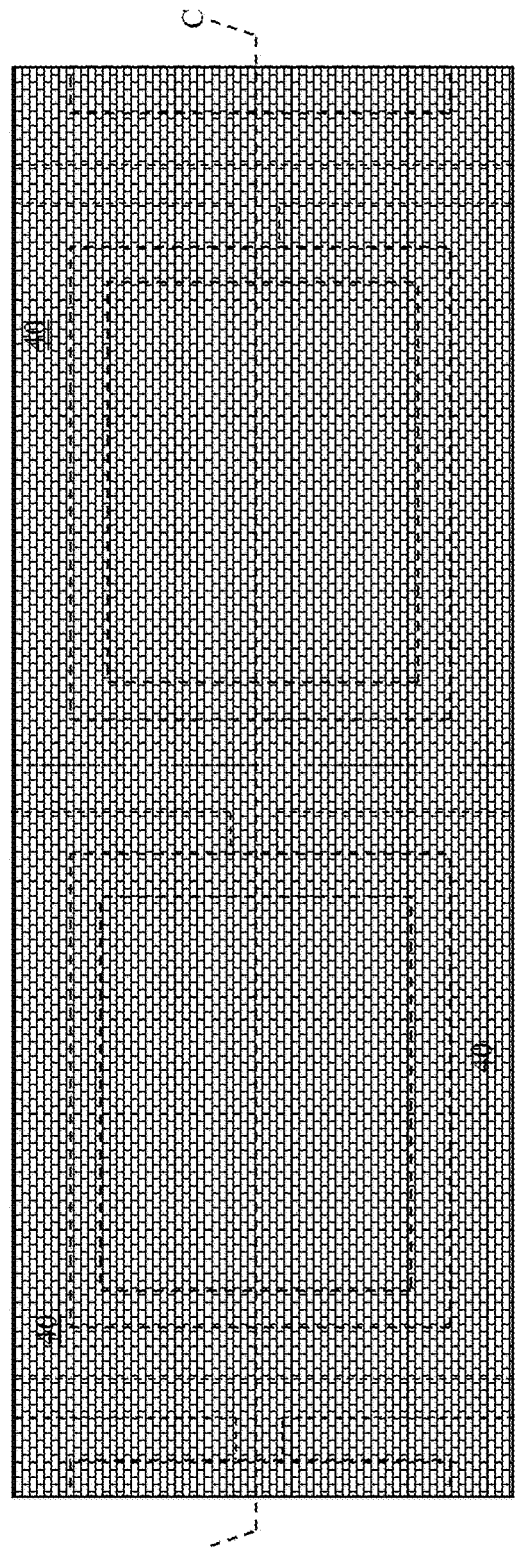

Referring to FIGS. 8A and 8B and step 135 an integrated circuit structures are formed in the portion of the patterned second semiconductor layer 30P surrounded by the patterned isolation layer 22P using photolithographic process and materials. In step 140 and referring to FIGS. 9A and 9B, one or more dielectric and electrically conductive layers 40 (e.g., including any combination of metal or silicon dioxide, patterned conductors, electrodes, or encapsulation layers) can be disposed and patterned on the patterned second semiconductor layer 30P to form a semiconductor device 34 in step 145 in or on the semiconductor material 30P. The semiconductor device 34 can include both a portion of the patterned second semiconductor layer 30P and the patterned one or more dielectric and metal layers 40P. The patterned second semiconductor layer 30P can also be processed in step 135, for example by implanting or by forming n- or p-doped regions in the patterned second semiconductor layer 30P. As indicated with the dashed arrow in FIG. 26, multiple steps 135 of deposition and 140 of patterning can be used to make the semiconductor device 34 in step 145.

The semiconductor device 34 can be formed in step 135 in crystalline silicon deposited on the patterned base semiconductor layer 32P to provide a high-performance semiconductor device 34, for example operable at fast clock rates and with low power. The portion of the patterned semiconductor material 30P that is processed to form the semiconductor device 34 is illustrated with cross hatching to indicate the completed semiconductor device 34. The patterned semiconductor material 30P portion of the semiconductor device 34 can be surrounded by patterned isolation material 22P in the isolation vias 36 in a direction parallel to the semiconductor substrate 10 that provides environmental and electrical protection to the patterned semiconductor material 30P portion of the semiconductor device 34. The dielectric and electrically conductive layer 40 can extend above the isolation material 22P so that at least a portion of the semiconductor device 24 is surrounded by the patterned isolation material 22P in one or more isolation vias 36. In combination with the patterned insulation layer 20P (which can be the same material as the isolation layer 22) and the dielectric and metal layers on the top of the patterned semiconductor material 30P, the semiconductor device 34 is protected from the environment and subsequent processing steps, such as etching steps.

As illustrated in FIGS. 10A and 10B, the final patterning steps 140 for patterning the electrically conductive and dielectric layer(s) to make the semiconductor device 34 in step 145 can expose the patterned semiconductor material 30P in the etch vias 38 for further processing. If the patterned semiconductor material 30P in the etch vias 38 is not already exposed, patterned semiconductor material 30P in the etch vias 38 is exposed in optional step 150 and as shown in FIGS. 10A and 10B.

Figure 11A:
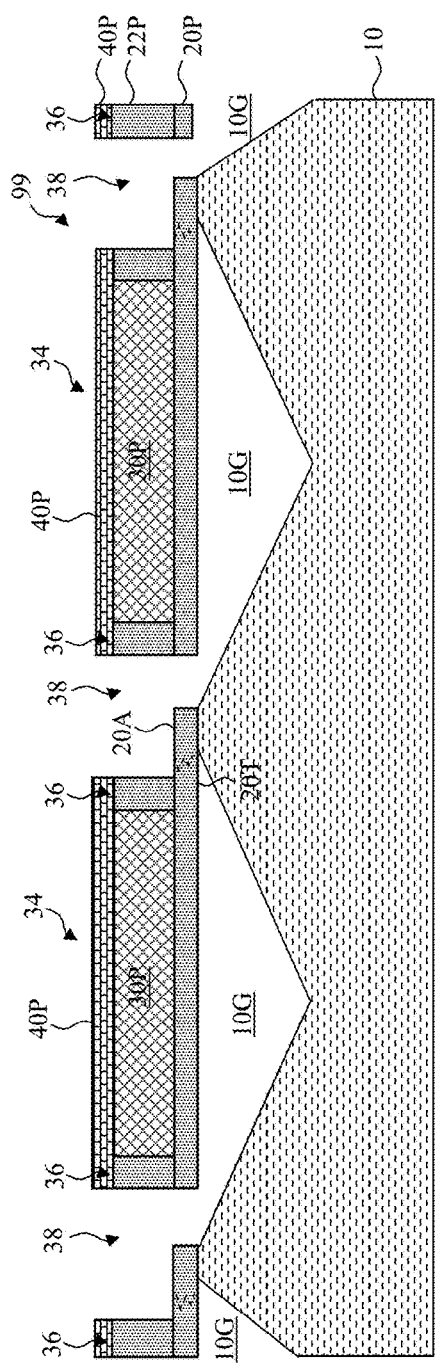
FIGS. 11A and 11B illustrate a cross section and corresponding plan view, respectively, of an embodiment of the present invention.
Figure 11B:
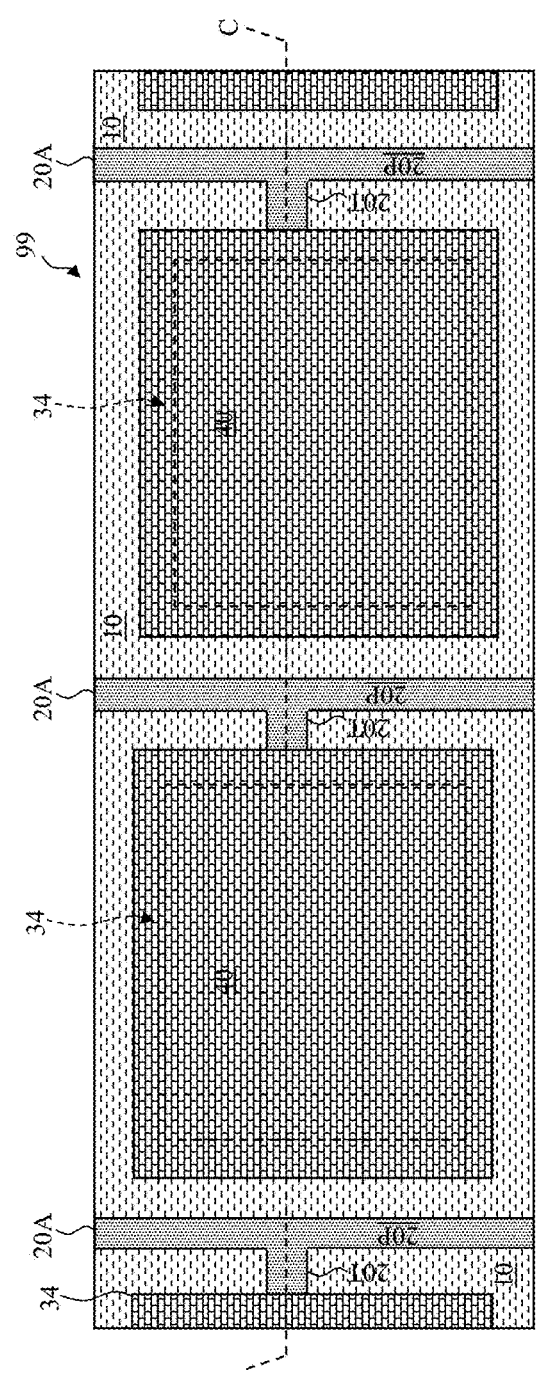

Referring to FIGS. 11A and 11B, the patterned semiconductor material 30P in the etch vias 38 is etched in step 155 to remove the patterned semiconductor material 30P from the etch vias 38 and to form a gap 10G in the semiconductor substrate 10 in a common step that undercuts and separates the semiconductor devices 34 from the semiconductor substrate 10 and exposes and forms a tether 20T physically connecting the semiconductor device 34 to an anchor 20A portion of the patterned insulation layer 20P or semiconductor substrate 10, or both. The semiconductor device 34 can then be micro-transfer printed. The semiconductor substrate 10 can be crystalline and the etch process (step 155) can anisotropically etch the crystalline semiconductor material in preferred crystal orientations and directions of the semiconductor substrate 10 to form the gap 10G, tether 20T, and anchor 20A.

Figure 12:
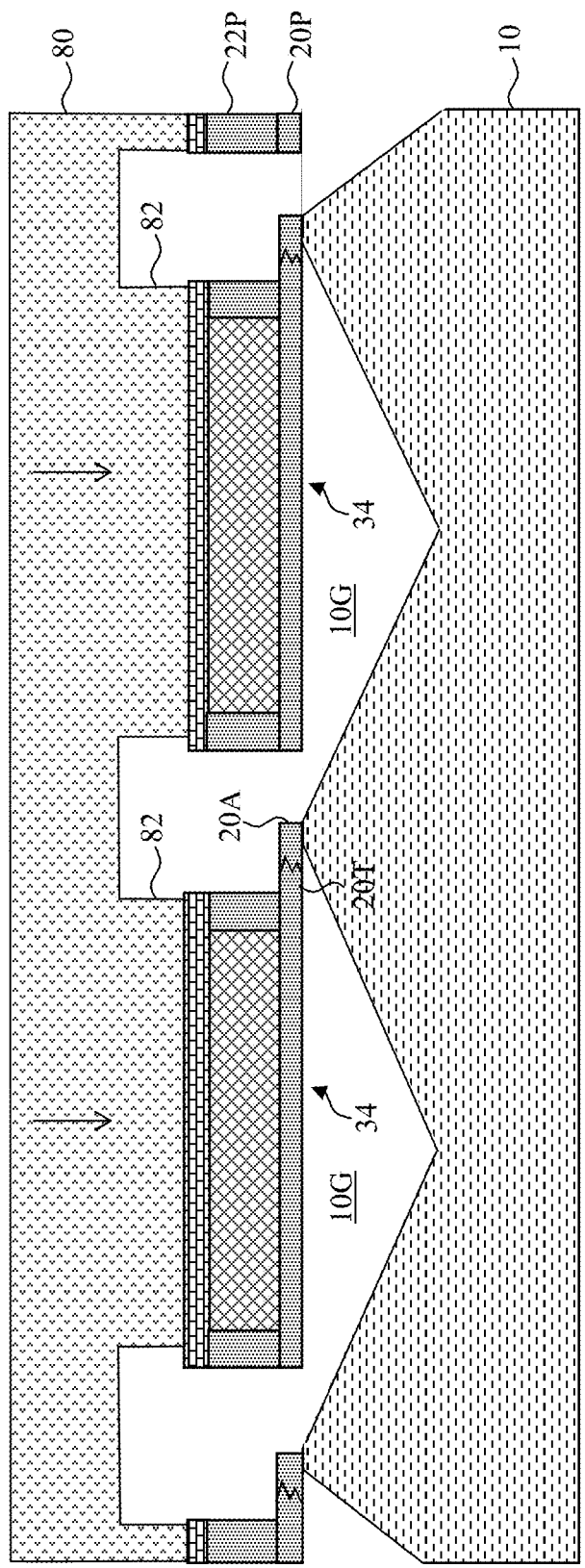
FIG. 12 illustrates micro-transfer printing semiconductor devices according to embodiments of the present invention.
Figure 13:
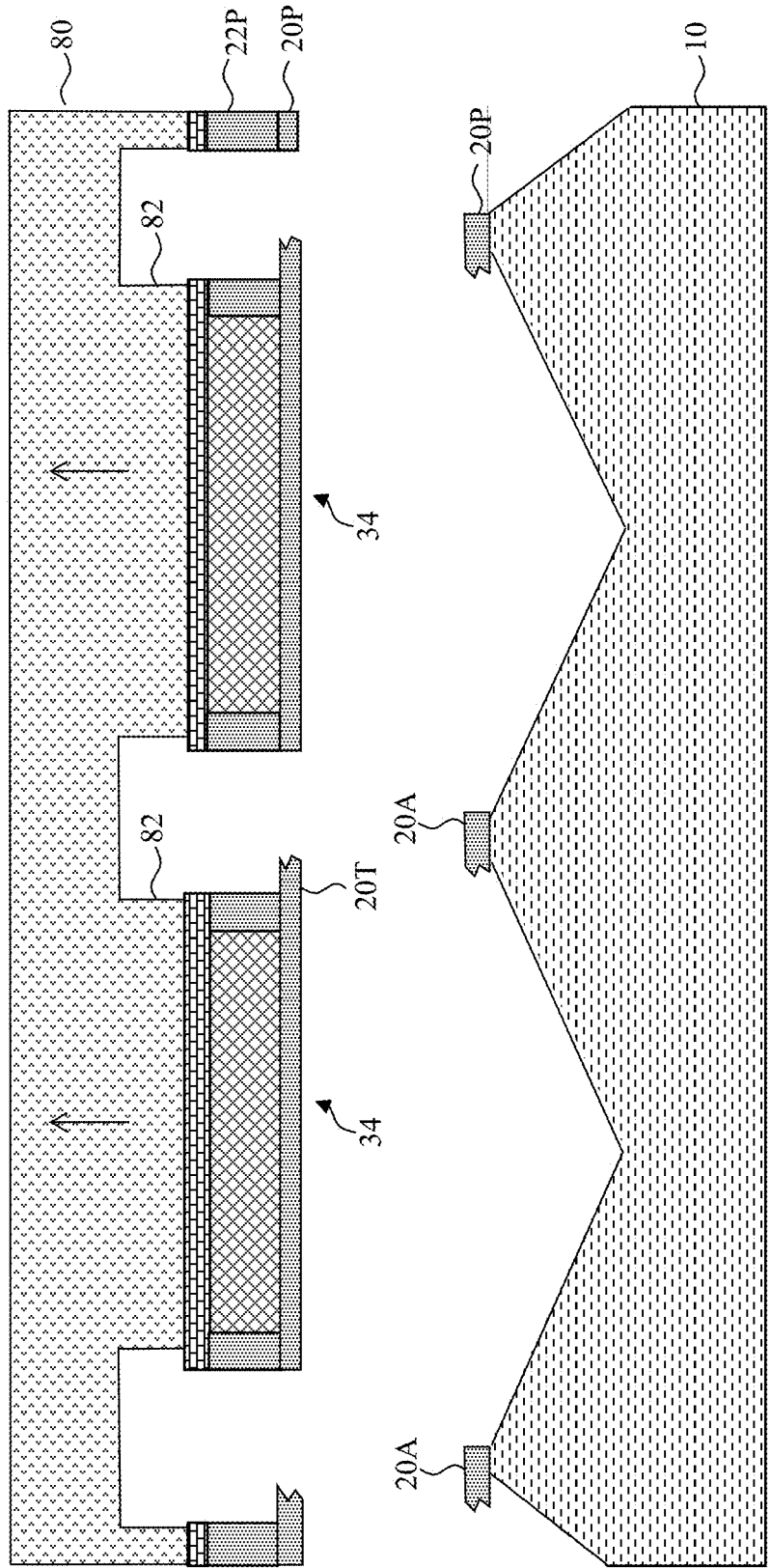
FIG. 13 illustrates micro-transfer printing semiconductor devices according to embodiments of the present invention.

As shown in FIGS. 12 and 13, in step 160 the semiconductor device 34 is micro-transfer printed from the semiconductor substrate 10 by pressing stamp pillars 82 of a stamp 80 against the semiconductor devices 34 to fracture and break the tethers 20T and adhere the semiconductor devices 34 to the stamp pillars 82 (FIG. 12). The stamp 80 is then removed with the adhered semiconductor devices 34 (FIG. 13) and the semiconductor devices 34 are contacted and adhered to a destination substrate and the stamp 80 removed (not shown).

As shown in FIGS. 10A and 10B, a semiconductor structure 99 suitable for micro-transfer printing includes the semiconductor substrate 10 and the patterned insulation layer 20P disposed on or over the semiconductor substrate 10. The insulation layer pattern defines one or more etch vias 38 in contact with the semiconductor substrate 10. The etch via 38 is exposed and can be empty or filled with a semiconductor material (e.g., patterned semiconductor material 30P) that is etchable with the semiconductor substrate 10 in a common step using a common etchant. A semiconductor device 34 is disposed on the patterned insulation layer 20P, at least a portion of the semiconductor device 34 is surrounded by a patterned isolation material 22P in one or more isolation vias 36 adjacent to the etch via 38. The patterned isolation material 22P can form a protective wall around the semiconductor device 34, for example a rectangular wall. In the embodiment of FIGS. 8A and 8B, each etch via 38 is at least partially filled with a semiconductor material that is etchable with a common etchant as the semiconductor substrate 10.

Referring to FIGS. 11A and 11B, the etch via 38 is empty and the semiconductor substrate 10 is patterned to form a gap 10G that separates at least a part of the semiconductor device 34 and the semiconductor substrate 10 and forms a tether 20T physically connecting the semiconductor device 34 to an anchor 20A portion of the semiconductor substrate 10 or the patterned insulation layer 20P.

In various embodiments of the present invention, the insulation layer 20 and the isolation material 22 are or include the same material, such as dielectric materials, silicon oxide, or silicon nitride. In other embodiments, the semiconductor substrate 10 and the semiconductor material 30 are or include the same material, are silicon, silicon <111> or silicon <100>.

A plurality of isolation vias 36 can surround a corresponding plurality of semiconductor devices 34, with each isolation via 36 adjacent to an etch via 38. The etch vias 38 can be connected to form an extended area over the semiconductor substrate 10 in contact with patterned isolation material 22P forming walled islands surrounding semiconductor devices 34.

In embodiments of the present invention, the semiconductor device 34 is an integrated circuit, is a light-emitting diode, includes a diode, or includes a transistor. The semiconductor device 34 can have a length or width less than or equal to 200 microns, less than or equal to 100 microns, less than or equal to 50 microns, less than or equal to 20 microns, less than or equal to 10 microns, less than or equal to 5 microns, or less than or equal to 2 microns. The semiconductor device 34 can have a thickness or depth less than or equal to one micron, two microns, five microns, ten microns, twenty microns, or fifty microns.

Figure 14A:
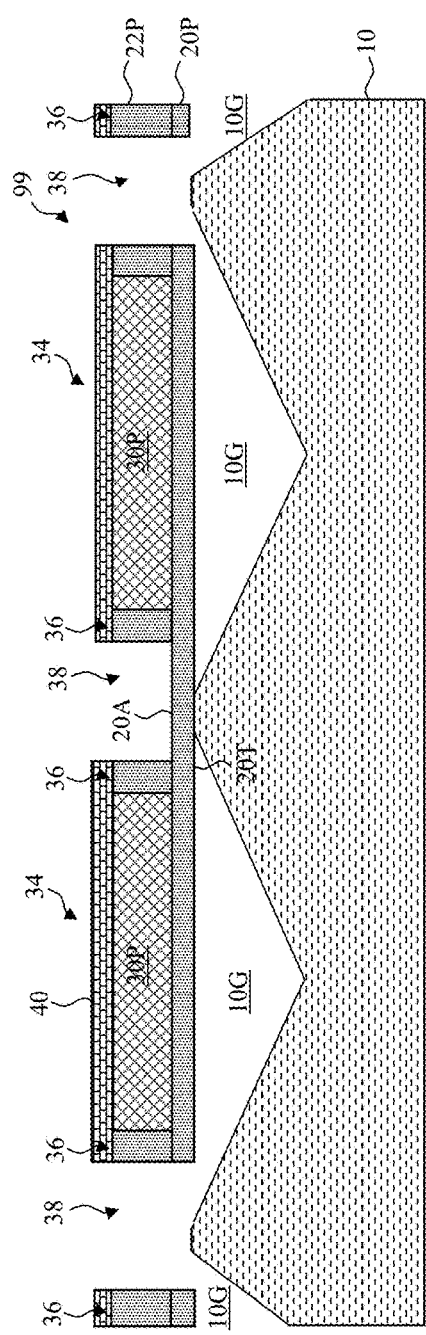
FIG. 14A is a cross section of the plan view of FIG. 14B, illustrating another semiconductor device of the present invention.
Figure 14B:
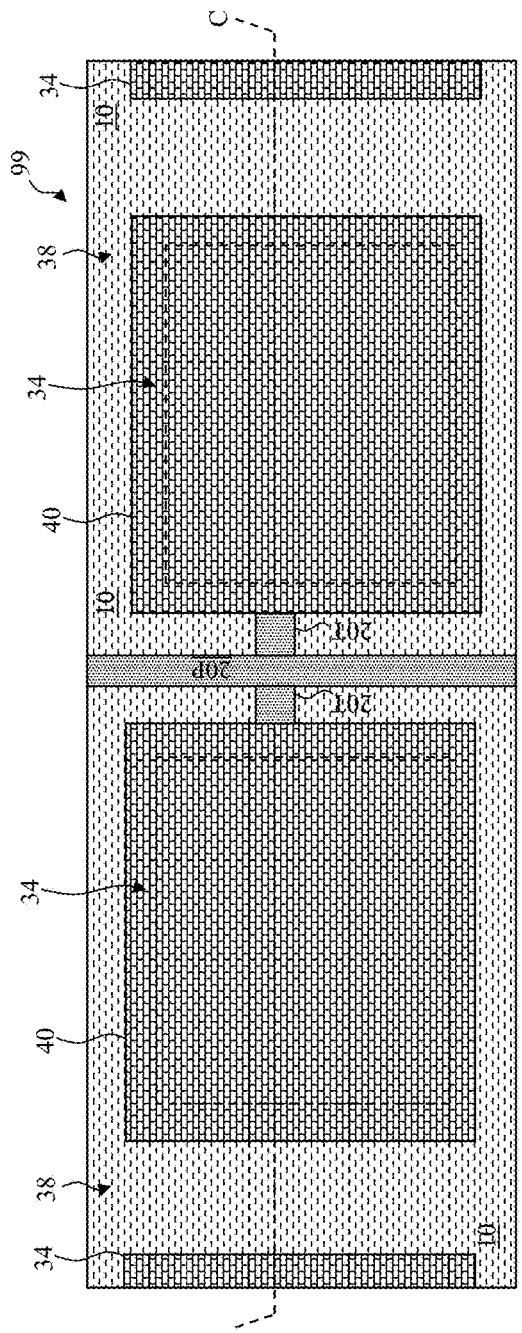

As shown in FIGS. 10A, 10B and 11A, 11B, a separate tether 20T and anchor 20A are formed by separate etch vias 38 in contact with the semiconductor substrate 10 and associated with each individual semiconductor device 34. In an alternative embodiment, an etch via 38 in contact with the semiconductor substrate 10 forms common tethers 20T and anchor 20A areas that are associated with two or more semiconductor devices 34. Referring to FIGS. 14A and 14B, an alternative structure is made using the process described in FIGS. 1-11, A and B, and FIG. 24, except that the pattern of the exposed insulation layer and the etch vias 38 are as shown, rather than as patterned in FIGS. 3A, 3B. This arrangement has the advantage of locating semiconductor devices 34 more closely together since fewer anchor structures 20A are needed.

In an alternative method of the present invention and referring to FIGS. 15-24, cross sections A taken across cross section line C of plan view B, the silicon-on-insulator (SOI) wafer is provided in step 100 as described above with respect to FIGS. 1A and 1B. The base semiconductor layer 32 and the insulation layer 20 are patterned in steps 105 and 110 as described above to expose a portion of the semiconductor substrate 10 through a corresponding etch via 38 (FIGS. 16A and 16B). The exposed portion of the semiconductor substrate 10 can almost surround a corresponding portion of the patterned first semiconductor layer 32P in a direction parallel to the semiconductor substrate 10 surface. In this embodiment, the base semiconductor layer 32 and the insulation layer 20 have the same pattern in the etch via 38. In step 115, the second semiconductor layer 30 is disposed (FIGS. 17A and 17B) as described with respect to FIGS. 4A and 4B above). In step 120 the second semiconductor layer 30 is patterned to form the isolation vias 36 (FIGS. 18A and 18B), as described with respect to FIGS. 5A and 5B above, and in the same locations.

In step 125 the isolation layer 22 is deposited in the isolation vias 36 and over the patterned second semiconductor layer 30P (FIGS. 19A and 19B), as described with respect to FIGS. 6A and 6B above. In step 130 the isolation layer 22 is patterned to expose the patterned second semiconductor layer 30P (FIGS. 20A and 20B), as described with respect to FIGS. 7A and 7B above. In step 135 the patterned second semiconductor layer 30P is processed to form integrated circuits 34 (FIGS. 21A, 21B, 8A, 8B) with any desired additional patterned dielectric or electrically conductive layer 40P in step 140 (FIGS. 22A and 22B), to make the semiconductor device 34 as described with respect to FIGS. 9A and 9B above. If necessary, the dielectric or electrically conductive layer 40P is patterned to expose the patterned semiconductor material 30P in the etch vias 38 (step 150, FIGS. 23A, 23B as described with respect to FIGS. 10A and 10B above). This patterning also exposes the etchable patterned semiconductor material 30P above the tether 20T.

Referring next to FIGS. 24A and 24B, in step 155 the patterned semiconductor material 30P is etched from the etch vias 38, along with material from the semiconductor substrate 10 as described above with respect to FIGS. 11A and 11B. Tethers 20T are formed in an exposed portion of the patterned insulation layer 20P. The semiconductor devices 34 can then be micro-transfer printed as described with respect to FIGS. 12 and 13 above. The etch vias of the FIGS. 24A and 24B structure are surrounded by the patterned insulation layer 20P forming a surrounding anchor structure 20A and therefore provides more control of the extent and time required for etching the semiconductor substrate 10 to release the semiconductor device 34.

In a further embodiment of the present invention and referring to FIGS. 25A, 25B (corresponding to FIGS. 21A 21B and constructed using the same process flow), a structure includes a second isolation via with patterned isolation material 22P around each anchor and a single etch via 38 around each semiconductor device 34 offset from the sides of the integrated circuit 34 and anchor and providing additional isolation. Such an embodiment has been used to construct and micro-transfer print semiconductor devices 34 to a destination substrate.

Figure 27A:
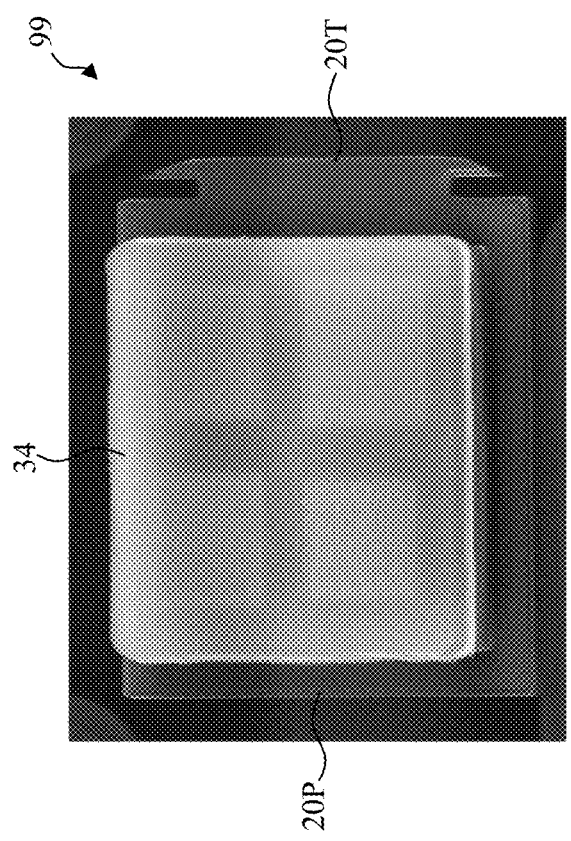
FIG. 27A is a detail photomicrograph of a semiconductor device according to an embodiment of the present invention.
Figure 27B:
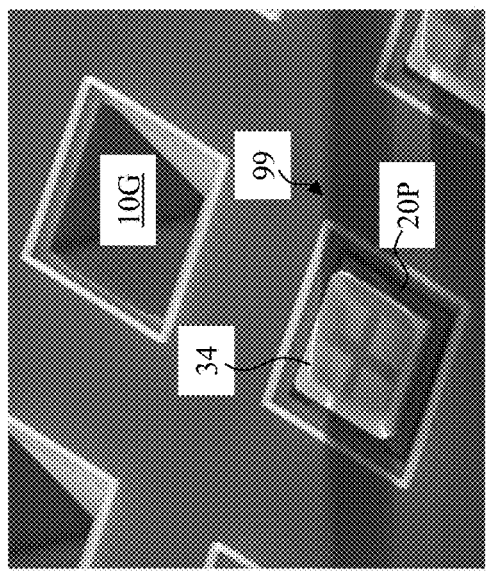
FIG. 27B is a perspective photomicrograph of the semiconductor device of FIG. 22A.
Figure 27C:
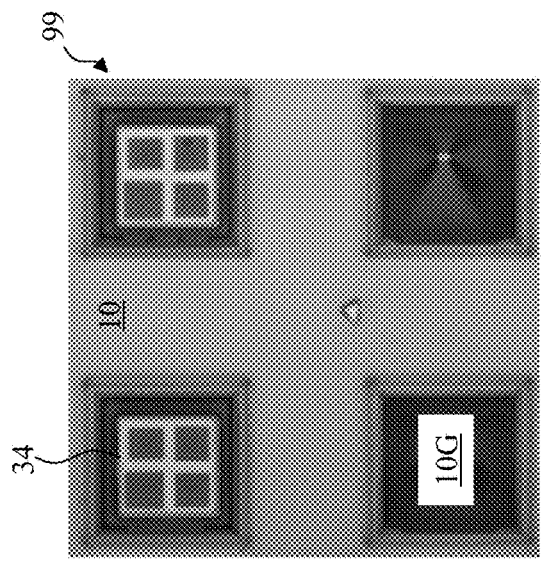
FIG. 27C is a plan view photomicrograph of the semiconductor device of FIG. 22A.

FIG. 27A is a detail photomicrograph of a micro-transfer-printed semiconductor device 34, a tether 20T, and patterned insulation layer 20P in accordance with an embodiment of the present invention. FIG. 27B is a perspective photomicrograph and FIG. 27C is a plan view photomicrograph of semiconductor structures 99 according to an embodiment of the present invention including the semiconductor device 34 of the detail FIG. 27A. In FIGS. 27B and 27C some of the semiconductor devices 34 are micro-transfer printed leaving gaps 10G.

Figure 28:
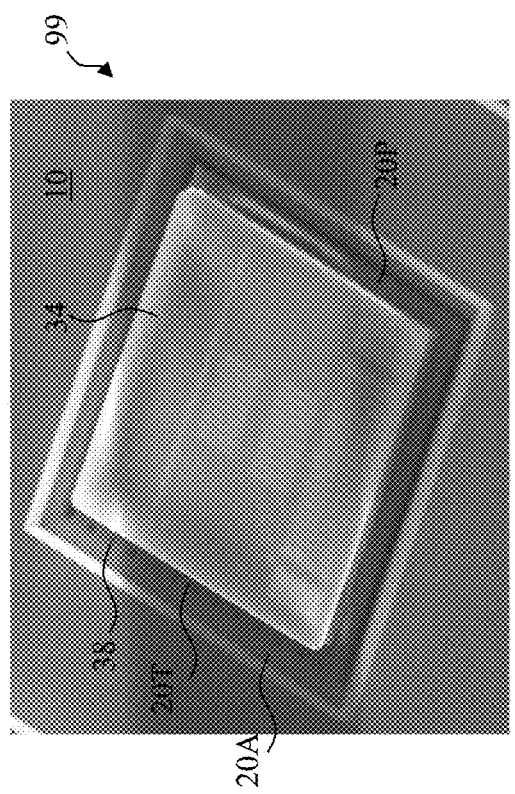
FIG. 28 is a perspective photomicrograph of a semiconductor device according to an embodiment of the present invention.

FIG. 28 is a semiconductor structure 99 having a different semiconductor device 34 on a semiconductor substrate 10 and indicating the patterned insulation layer 20P forming the tethers 20T and anchors 20A.

The micro-transfer printable semiconductor devices 34 made by methods of the present invention can include a variety of semiconductor structures, including a diode, a light-emitting diode (LED), a laser, a laser diode, a photo-diode, a photo-transistor, a transistor, an integrated circuit, a digital circuit, or a CMOS integrated circuit.

In embodiments of the present invention, the micro-transfer printable semiconductor devices 34 have a length greater than width, for example having an aspect ratio greater than or equal to 1.5, 2, 4, 8, 10, 20, or 50, and electrical contacts that are adjacent to the ends of the semiconductor devices 34 along the length of the micro-transfer printable semiconductor devices 34. The semiconductor devices 34 can have a variety of different sizes. For example, the semiconductor devices 34 can have a width from 0.5 to 2 µm, 2 to 5 µm, 5 to 10 µm, 10 to 20 µm, or 20 to 50 µm, a length from 2 to 5 µm, 5 to 10 µm, 10 to 20 µm, or 20 to 50 µm, 50 to 100 µm, or 100 to 250 µm, or a thickness from 0.5 to 1 µm, 1 to 2 µm, 2 to 5 µm, 4 to 10 µm, 10 to 20 µm, or 20 to 50 µm.

Methods of forming micro-transfer printable structures are described, for example, in the paper AMOLED Displays using Transfer-Printed Integrated Circuits (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, which is hereby incorporated by reference in its entirety. Additional details useful in understanding and performing aspects of the present invention are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

C cross section line
10 semiconductor substrate
10G gap
20 insulation layer
20A anchor
20P patterned insulation layer
20T tether
22 isolation material/layer
22P patterned isolation material/layer
30 semiconductor material/second semiconductor layer
30P patterned semiconductor material/patterned second semiconductor layer
32 base semiconductor layer
32P patterned base semiconductor layer/patterned first semiconductor layer
34 semiconductor device
36 isolation via
38 etch via
40 metal and dielectric layer(s)
40P patterned metal and dielectric layer(s)
80 stamp
82 stamp pillar
99 semiconductor structure
100 provide semiconductor substrate step
105 pattern seed layer step
110 pattern insulation layer step
115 dispose semiconductor layer step
120 pattern semiconductor layer step
125 dispose isolation layer step
130 pattern isolation layer step
135 form integrated circuitry step
140 pattern metal and dielectric layer(s) step
145 form semiconductor device step
150 expose etch via step
155 etch semiconductor layer and substrate step
160 micro-transfer print semiconductor device step

What is claimed:

1. A semiconductor structure suitable for use in micro-transfer printing, comprising:
    a semiconductor substrate;
    a patterned insulation layer disposed on or over the semiconductor substrate, the patterned insulation layer comprising an insulation material and defining one or more etch vias extending through the patterned insulation layer and in contact with the semiconductor substrate; and
    a semiconductor device disposed entirely on the patterned insulation layer, wherein at least a portion of the semiconductor device is surrounded by an isolation material in one or more isolation vias disposed on the patterned insulation layer, the one or more isolation vias are adjacent to and in contact with at least one of the one or more etch vias, and the patterned insulation layer is disposed at least partially between the semiconductor device and the semiconductor substrate, wherein the semiconductor substrate and the semiconductor device comprise one or more semiconductor materials that are differentially etchable from the isolation material and from the insulation material, wherein the one or more etch vias are at least partially filled with one of the one or more semiconductor materials, and wherein the semiconductor device is electrically isolated from the semiconductor substrate.

2. The semiconductor structure of claim 1, wherein the patterned insulation layer and the isolation material comprise a same material.

3. The semiconductor structure of claim 1, wherein the semiconductor substrate and the semiconductor device comprise a same crystalline material.

4. The semiconductor structure of claim 1, comprising a plurality of isolation vias surrounding a corresponding plurality of semiconductor devices disposed on the patterned insulation layer, wherein each isolation via of the plurality of isolation vias is adjacent to and in contact with an etch via.

5. The semiconductor structure of claim 4, wherein the patterned insulation layer defines a corresponding unique etch via for each semiconductor device of the plurality of semiconductor devices such that a portion of the semiconductor substrate under each semiconductor device can be etched by an etchant provided through the corresponding unique via.

6. The semiconductor structure of claim 4, wherein the patterned insulation layer defines a common etch via corresponding to two or more semiconductor devices of the plurality of semiconductor devices such that a portion of the semiconductor substrate under each of the two or more semiconductor devices can be etched by an etchant provided through the common etch via.

7. The semiconductor structure of claim 1, wherein the one or more etch vias are at least partially filled with a semiconductor material that is etchable with a common etchant as the semiconductor substrate.

8. The semiconductor structure of claim 1, wherein (i) the semiconductor device is an integrated circuit, (ii) the semiconductor device is a light-emitting diode, (iii) the semiconductor device comprises a diode, (iv) the semiconductor device comprises a transistor, or any combination of (i), (ii), (iii), and (iv).

9. The semiconductor structure of claim 1, wherein the semiconductor device has at least one of a length and a width less than or equal to 1000 microns.

10. The semiconductor structure of claim 1, wherein the semiconductor device has a thickness less than or equal to fifty microns.

11. The semiconductor structure of claim 1, wherein the one or more tethers comprise a buried oxide layer in a silicon on insulator substrate.

12. The semiconductor structure of claim 1, wherein the insulation layer and the isolation material are at least one of a dielectric material, a silicon oxide and a silicon nitride.

13. The semiconductor structure of claim 1, wherein the semiconductor substrate and the semiconductor material are silicon, silicon <1 1 1>, or silicon <1 0 0>.

* * * * *